(12) United States Patent
Kaneko et al.

(10) Patent No.: US 10,998,696 B2
(45) Date of Patent: May 4, 2021

(54) VERTICAL CAVITY SURFACE EMITTING LASER

(71) Applicant: SUMITOMO ELECTRIC INDUSTRIES, LTD., Osaka (JP)

(72) Inventors: Natsumi Kaneko, Osaka (JP); Yutaka Onishi, Osaka (JP); Takeshi Aoki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/570,359

(22) Filed: Sep. 13, 2019

(65) Prior Publication Data

US 2020/0099195 A1    Mar. 26, 2020

(30) Foreign Application Priority Data

Sep. 21, 2018  (JP) .............................. JP2018-177670
Jun. 28, 2019  (JP) .............................. JP2019-121272

(51) Int. Cl.
*H01S 5/183*   (2006.01)
*H01S 5/343*   (2006.01)
*H01S 5/30*    (2006.01)

(52) U.S. Cl.
CPC ........ *H01S 5/18322* (2013.01); *H01S 5/3077* (2013.01); *H01S 5/3432* (2013.01); *H01S 5/34353* (2013.01); *H01S 2304/04* (2013.01)

(58) Field of Classification Search
CPC .. H01S 5/18322; H01S 5/3432; H01S 5/3077; H01S 5/34353; H01S 2304/04; H01S 2301/176; H01S 5/0021; H01S 5/3215; H01S 5/18361; H01S 5/18358; H01S 5/18347; H01S 5/18311
See application file for complete search history.

(56) References Cited

U.S. PATENT DOCUMENTS

2010/0208764 A1*  8/2010  Otoma ................ H01S 5/04254
                                                372/50.1
2012/0020383 A1*  1/2012  Shimizu .............. H01S 5/18358
                                                372/45.01

OTHER PUBLICATIONS

Fukatsu, Kimiyoshi, et al.,30 Gb/s over 100-m MMFs Using 1.1-μm Range VCSELs and Photodiodes, *IEEE Photonics Technology Letters*, vol. 20, No. 11, p. 909-p. 911, (Jun. 1, 2008).

* cited by examiner

*Primary Examiner* — Xinning(Tom) Niu
(74) *Attorney, Agent, or Firm* — Smith, Gambrell & Russell, LLP.

(57) ABSTRACT

A vertical cavity surface emitting laser includes a first laminate including first semiconductor layers having a first Al composition, and second semiconductor layers having a second Al composition greater than the first Al composition; a current confinement structure including a current aperture and a current blocker; a first compound semiconductor layer adjacent to the current confinement structure; and a second compound semiconductor layer adjacent to the first laminate and the first compound semiconductor layer. The first compound semiconductor layer has a first aluminum profile changing monotonously in a direction from the first laminate to the current confinement structure from a first minimum Al composition within a range greater than the first Al composition and smaller than the second Al composition to a first maximum Al composition. The second compound semiconductor layer has an Al composition greater than the first Al composition and smaller than the first maximum Al composition.

14 Claims, 20 Drawing Sheets

VERTICAL CAVITY SURFACE EMITTING LASER

CROSS REFERENCE TO RELATED APPLICATIONS

The present application is based upon and claims the benefit of the priority from Japanese patent applications No. 2018-177670 filed on Sep. 21, 2018 and No. 2019-121272 filed on Jun. 28, 2019 which are hereby incorporated by reference in their entireties.

TECHNICAL FIELD

The present disclosure relates to a vertical cavity surface emitting laser.

BACKGROUND

"Kimiyoshi Fukatsu et al., IEEE Photonics Technology Letters, vol. 20, no. 11, pp. 909-911, 2008" discloses a surface emitting laser.

SUMMARY

The present disclosure provides a vertical cavity surface emitting laser comprising: an active layer provided inside a semiconductor post; a first laminate for distributed Bragg reflection, the first laminate provided inside the semiconductor post; a current confinement structure comprising a current aperture and a current blocker surrounding the current aperture, the current confinement structure provided inside the semiconductor post; a first compound semiconductor layer provided inside the semiconductor post, wherein first compound semiconductor layer is adjacent to the current confinement structure between the first laminate and the current confinement structure; and a second compound semiconductor layer provided inside the semiconductor post, wherein the second compound semiconductor layer is adjacent to the first laminate and the first compound semiconductor layer between the first laminate and the first compound semiconductor layer, wherein the current aperture includes a III-V compound semiconductor containing elemental aluminum as a Group III constituent element, wherein the current blocker includes Group III oxide, wherein the first laminate includes a first semiconductor layer and a second semiconductor layer which are arranged alternately, the first semiconductor layer comprising a first III-V semiconductor having a first Al composition, the second semiconductor layer comprising a second III-V semiconductor having a second Al composition greater than the first Al composition, wherein each of the first compound semiconductor layer and the second compound semiconductor layer contains elemental aluminum as a Group III constituent element, wherein the first compound semiconductor layer comprises a first aluminum profile changing monotonously in a direction from the first laminate to the current confinement structure from a first minimum Al composition within a range greater than the first Al composition and smaller than the second Al composition to a first maximum Al composition greater than the first minimum Al composition, wherein the second compound semiconductor layer comprises an Al composition greater than the first Al composition and smaller than the first maximum Al composition, and wherein the III-V compound semiconductor of the current aperture comprises an Al composition greater than the second Al composition.

BRIEF DESCRIPTION OF THE DRAWINGS

The foregoing and other purposes, aspects and advantages will be better understood from the following detailed description of a preferred embodiment of the invention with reference to the attached drawings.

DETAILED DESCRIPTION

Figure 1:
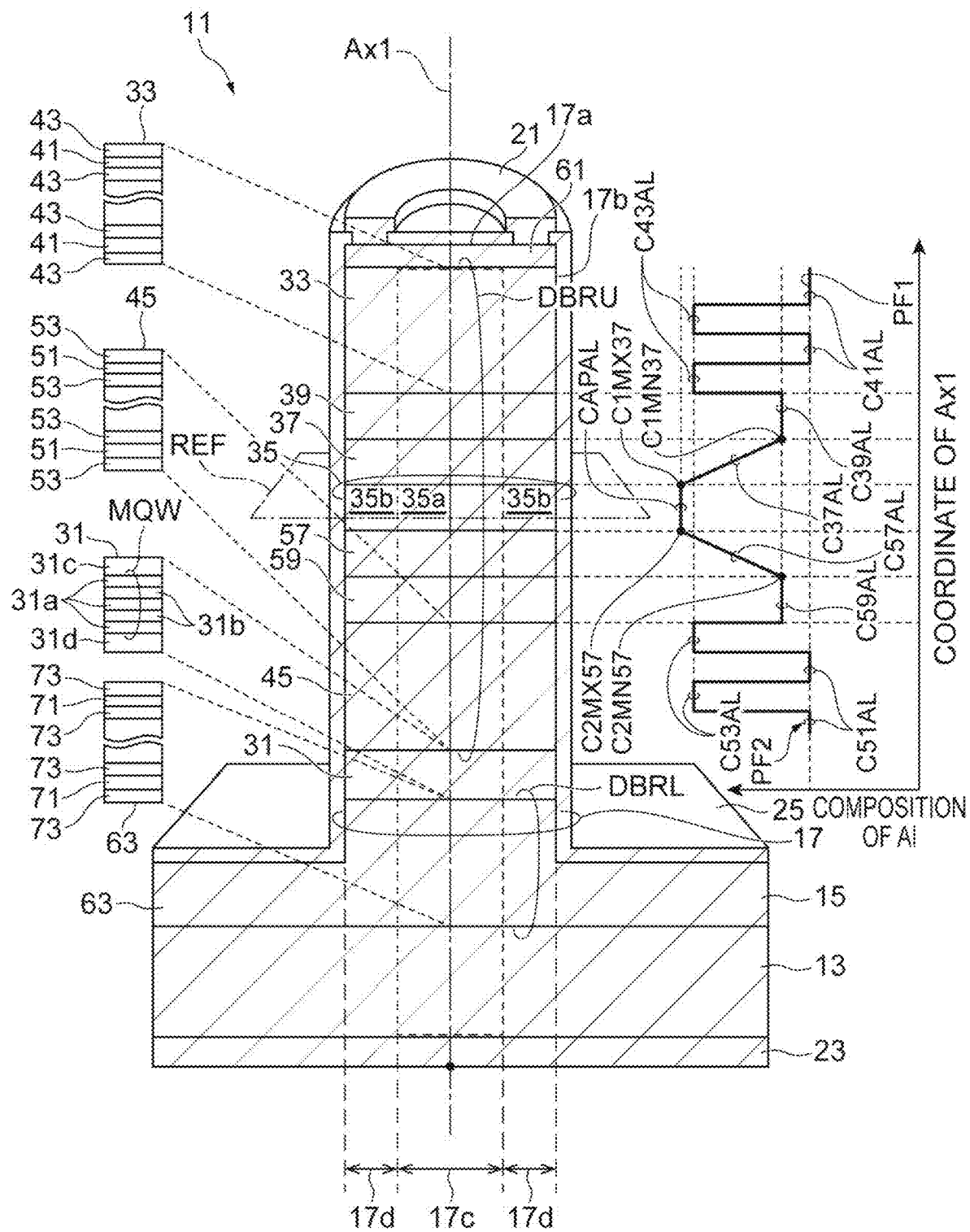
FIG. 1 is a diagram illustrating a vertical cavity surface emitting laser according to the present embodiment.

Problem to be Solved by the Present Disclosure

Some vertical cavity surface emitting lasers uses an oxide confinement structure for current confinement. An oxide confinement structure is prepared as follows: a semiconductor post including a semiconductor layer having a high Al composition is formed; and the semiconductor post is oxidized in an oxidizing atmosphere, thereby obtaining an oxide confinement structure having a current aperture. The oxide confinement structure is formed from a semiconductor layer having the highest Al composition inside the semiconductor post. Oxidizing a semiconductor layer in an oxidizing atmosphere may become a cause of manufacturing unevenness in manufacturing steps. In vertical cavity surface emitting lasers, various sizes and shapes are required for a semiconductor post in an aspect of their characteristic surface, and various sizes are also required for a current aperture.

Advantageous Effect of the Present Disclosure

According to the present disclosure, a vertical cavity surface emitting laser having a structure in which a change in differential resistance is not greatly sensitive to fluctuation in size of a current aperture can be provided.

DESCRIPTION OF EMBODIMENTS OF THE PRESENT DISCLOSURE

Some specific examples will be described.

According to a specific example, a vertical cavity surface emitting laser includes (a) an active layer provided inside a semiconductor post, (b) a first laminate for distributed Bragg reflection, the first laminate provided inside the semiconductor post, (c) a current confinement structure comprising a current aperture and a current blocker surrounding the current aperture, the current confinement structure provided inside the semiconductor post, (d) a first compound semiconductor layer provided inside the semiconductor post, wherein the first compound semiconductor layer is adjacent to the current confinement structure between the first laminate and the current confinement structure, and (e) a second compound semiconductor layer provided inside the semiconductor post, wherein the second compound semiconductor layer is adjacent to the first laminate and the first compound semiconductor layer between the first laminate and the first compound semiconductor layer. The current aperture includes a III-V compound semiconductor containing elemental aluminum as a Group III constituent element, and the current blocker includes Group III oxide. The first laminate includes a first semiconductor layer and a second semiconductor layer which are arranged alternately, the first semiconductor layer has a first III-V semiconductor having a first Al composition, and the second semiconductor layer has a second III-V semiconductor having a second Al composition greater than the first Al composition. Each of the first compound semiconductor layer and the second compound semiconductor layer contains elemental aluminum as a Group III constituent element. The first compound semiconductor layer has a first aluminum profile changing monotonously in a direction from the first laminate to the current confinement structure from a first minimum Al composition within a range greater than the first Al composition and smaller than the second Al composition to a first maximum Al composition greater than the first minimum Al composition. The second compound semiconductor layer has an Al composition greater than the first Al composition and equivalent to or smaller than the first maximum Al composition. The III-V compound semiconductor of the current aperture has an Al composition greater than the second Al composition.

According to the vertical cavity surface emitting laser, the first minimum Al composition greater than the first Al composition of the first laminate is applied to the first compound semiconductor layer adjacent to the current confinement structure. The first aluminum profile changes monotonously from this first minimum Al composition in the direction from the first laminate to the current confinement structure. An Al composition greater than the first Al composition and smaller than the first maximum Al composition is applied to the second compound semiconductor layer adjacent to the first laminate and the first compound semiconductor layer. The first compound semiconductor layer and the second compound semiconductor layer make it possible to avoid a differential resistance in the vertical cavity surface emitting laser being highly dependent on unevenness in size of the current aperture.

In addition, in the III-V compound semiconductor containing aluminum as a Group III constituent element, a bandgap increases in accordance with increase in the Al composition. However, the second compound semiconductor layer having an Al composition greater than the first Al composition is effective in reducing the differential resistance.

An Al composition greater than the first Al composition and equivalent to or smaller than the first minimum Al composition can be applied to the second compound semiconductor layer.

According to a specific example, in the vertical cavity surface emitting laser, the first minimum Al composition may be greater than half a difference between the second Al composition and the first Al composition.

According to the vertical cavity surface emitting laser, a small composition range in an Al composition gradient of the first compound semiconductor layer and the second compound semiconductor layer having a significant Al composition are effective in reducing the differential resistance.

According to a specific example, in the vertical cavity surface emitting laser, the first minimum Al composition may be within a range of 0.25 or greater. The Al composition of the second compound semiconductor layer may be the first minimum Al composition of the first compound semiconductor layer. The first aluminum profile may have the Al composition of the current aperture on a boundary surface between the current aperture and the first compound semiconductor layer.

According to the vertical cavity surface emitting laser, a continuous aluminum profile can be provided for arrangement of the current aperture, the first compound semiconductor layer, and the second compound semiconductor layer. In addition, the first minimum Al composition smaller than 0.25 increases the unevenness in differential resistance with respect to the size of the current aperture. In addition, the first minimum Al composition greater than 0.75 deteriorates the reflectance in Bragg reflection.

The difference between the Al compositions in the current aperture of the current confinement structure and the second compound semiconductor layer is smaller than the difference between the Al compositions of the first semiconductor layer in the first laminate and the second semiconductor layer.

According to a specific example, in the vertical cavity surface emitting laser, the first compound semiconductor layer may include a first part and a second part which are arranged sequentially in a direction from the current confinement structure to the first laminate. The first aluminum profile may have a first change rate and a second change rate at points inside the first part and the second part, respectively. The first change rate may have an absolute value smaller than an absolute value for a linear change rate of a difference between the first maximum Al composition and the first minimum Al composition with respect to a thickness of the first compound semiconductor layer, and the absolute value for the first change rate may be smaller than an absolute value for the second change rate.

According to the vertical cavity surface emitting laser, the first compound semiconductor layer can have an aluminum profile changing gently in the vicinity of the current confinement structure. When a gentle change rate is applied to the Al composition in the vicinity of the current confinement structure, change in long-term operation characteristics decreases.

Specifically, the first change rate has an absolute value smaller than the absolute value for the linear change rate of the difference between the first maximum Al composition and the first minimum Al composition with respect to the thickness of the first compound semiconductor layer, and the absolute value for the first change rate is smaller than the absolute value for the second change rate.

According to a specific example, the vertical cavity surface emitting laser may further include a second laminate provided inside the semiconductor post for distributed Bragg reflection, a third compound semiconductor layer provided inside the semiconductor post, wherein the compound semiconductor layer is adjacent to the current confinement structure between the second laminate and the current confinement structure, and a fourth compound semiconductor layer provided inside the semiconductor post, wherein the fourth compound semiconductor layer is adjacent to the second laminate and the third compound semiconductor layer between the second laminate and the third compound semiconductor layer. The second laminate may include a first semiconductor layer and a second semiconductor layer which are arranged alternately, the first semiconductor layer may have a third III-V semiconductor having a third Al composition, and the second semiconductor layer may have a fourth III-V semiconductor having a fourth Al composition greater than the third Al composition. The third compound semiconductor layer and the fourth compound semiconductor layer may contain elemental aluminum as a Group III constituent element. The third compound semiconductor layer may have a second aluminum profile changing monotonously in a direction from the second laminate to the current confinement structure from a second minimum Al composition within a range greater than the third Al composition and smaller than the fourth Al composition to a second maximum Al composition greater than the second minimum Al composition. The fourth compound semiconductor layer may have an Al composition greater than the third Al composition and equivalent to or smaller than the second minimum Al composition.

According to the vertical cavity surface emitting laser, the second minimum Al composition greater than the third Al composition of the second laminate is applied to the third compound semiconductor layer adjacent to the second laminate and the current confinement structure. In the third compound semiconductor layer, the second aluminum profile changes monotonously from this second minimum Al composition in the direction from the second laminate to the current confinement structure. An Al composition greater than the third Al composition and equivalent to or smaller than the second minimum Al composition is applied to the fourth compound semiconductor layer adjacent to the second laminate and the third compound semiconductor layer. The third compound semiconductor layer and the fourth compound semiconductor layer make it possible to avoid a differential resistance in the vertical cavity surface emitting laser being highly dependent on unevenness in size of the current aperture.

In addition, the III-V compound semiconductor containing aluminum as a Group III constituent element has a bandgap increasing in accordance with increase in the Al composition. However, the fourth compound semiconductor layer having an Al composition greater than the third Al composition is effective in reducing the differential resistance.

According to a specific example, in the vertical cavity surface emitting laser, the second minimum Al composition may be 0.25 or greater. The Al composition of the fourth compound semiconductor layer may be the second minimum Al composition of the third compound semiconductor layer. The second aluminum profile may have the Al composition of the current aperture on a boundary surface between the current aperture and the third compound semiconductor layer.

According to the vertical cavity surface emitting laser, a continuous aluminum profile can be provided for arrangement of the current aperture, the first compound semiconductor layer, and the second compound semiconductor layer. In addition, the differential resistance increases unevenness with respect to the size of the current aperture with the first minimum Al composition smaller than 0.25. The second minimum Al composition greater than 0.75 deteriorates the reflectance in Bragg reflection.

The difference between the Al compositions in the current aperture of the current confinement structure and the fourth compound semiconductor layer is smaller than the difference between the Al compositions of the first semiconductor layer in the second laminate and the second semiconductor layer.

According to a specific example, in the vertical cavity surface emitting laser, the third compound semiconductor layer may include a first part and a second part which are arranged sequentially in a direction from the current confinement structure to the second laminate. The second aluminum profile may have a third change rate and a fourth change rate at points inside the first part and the second part, respectively. The third change rate may have an absolute value smaller than an absolute value for a linear change rate of a difference between the second maximum Al composition and the second minimum Al composition with respect to a thickness of the third compound semiconductor layer, and the absolute value for the third change rate may be smaller than an absolute value for the fourth change rate.

According to the vertical cavity surface emitting laser, the third compound semiconductor layer can have an aluminum profile changing gently in the vicinity of the current confinement structure. When a small change rate is applied to the Al composition in the vicinity of the current confinement structure, change in long-term operation characteristics decreases.

According to a specific example, the vertical cavity surface emitting laser may further include a second laminate for distributed Bragg reflection, the second laminate provided inside the semiconductor post, and a third compound semiconductor layer provided inside the semiconductor post, wherein the third compound semiconductor layer is adjacent to the current confinement structure between the second laminate and the current confinement structure. The second laminate may include a first semiconductor layer and a second semiconductor layer which are arranged alternately, the first semiconductor layer may have a third III-V semiconductor having a third Al composition, and the second semiconductor layer may have a fourth III-V semiconductor having a fourth Al composition greater than the third Al composition. The third compound semiconductor layer may contain elemental aluminum as a Group III constituent element. The third compound semiconductor layer may have a second aluminum profile changing monotonously in a direction from the second laminate to the current confinement structure from a second minimum Al composition less than 0.25 to a second maximum Al composition greater than the second minimum Al composition.

According to the vertical cavity surface emitting laser, the fourth compound semiconductor layer having an Al composition equivalent to or smaller than the second minimum Al composition can increase a change in refractive index on a boundary surface between the fourth compound semiconductor layer and the second laminate.

DETAILED DESCRIPTION OF THE EMBODIMENTS OF THE PRESENT DISCLOSURE

The knowledge of the present invention can be easily understood by considering the following detailed description with reference to the accompanying drawings illustrated as examples. Subsequently, an embodiment according to a vertical cavity surface emitting laser will be described with reference to the accompanying drawings. If possible, the same reference signs are applied to the same parts.

FIG. 1 is a partial breakaway view illustrating a vertical cavity surface emitting laser according to the present embodiment. A vertical cavity surface emitting laser 11 includes an active layer 31, a first laminate 33, a current confinement structure 35, a first compound semiconductor layer 37, and a second compound semiconductor layer 39. The active layer 31, the first laminate 33, the current confinement structure 35, the first compound semiconductor layer 37, and the second compound semiconductor layer 39 are provided inside a post 17. The current confinement structure 35, the first compound semiconductor layer 37, the second compound semiconductor layer 39, and the first laminate 33 are arranged in a direction of a first axis Ax1. In the vertical cavity surface emitting laser which will be described subsequently, the current confinement structure 35, the first compound semiconductor layer 37, and the second compound semiconductor layer 39 are disposed between the first laminate 33 and the active layer 31.

The first laminate 33 includes first semiconductor layers 41 and second semiconductor layers 43 which are arranged alternately for distributed Bragg reflection. Each of the first semiconductor layers 41 has the first III-V semiconductor having a first Al composition C41AL. Each of the second semiconductor layers 43 has the second III-V semiconductor having a second Al composition C43AL greater than the first Al composition C41AL.

The current confinement structure 35 includes a current aperture 35a and a current blocker 35b surrounding the current aperture 35a. The current aperture 35a includes the III-V compound semiconductor containing elemental aluminum as a Group III constituent element. The current blocker 35b contains Group III oxide and surrounds the current aperture 35a. The current aperture 35a has a thickness within a range of 10 to 50 nm.

The first compound semiconductor layer 37 comes into contact with the current confinement structure 35 between the first laminate 33 and the current confinement structure 35. The second compound semiconductor layer 39 comes into contact with the first laminate 33 and the first compound semiconductor layer 37 between the first laminate 33 and the first compound semiconductor layer 37. Each of the first compound semiconductor layer 37 and the second compound semiconductor layer 39 contains elemental aluminum as a Group III constituent element.

The first compound semiconductor layer 37 has an Al composition C37AL in a first aluminum profile (PF1) defined on the first axis Ax1. The Al composition C37AL changes monotonously from a first minimum Al composition C1MN37 to a first maximum Al composition C1MX37 in a direction from the first laminate 33 to the current confinement structure 35. The first minimum Al composition C1MN37 is within a range greater than the first Al composition C41AL and smaller than the second Al composition C43AL. The first maximum Al composition C1MX37 is greater than the first minimum Al composition C1MN37.

The second compound semiconductor layer 39 has an Al composition C39AL within a range greater than the first Al composition C41AL and equivalent to or smaller than the first maximum Al composition C1MX37. The Al composition C39AL can be equivalent to or smaller than the first minimum Al composition C1MN37. In the present Example, the Al composition C39AL can be substantially uniform. The III-V compound semiconductor of the current aperture 35a has an Al composition CAPAL greater than the second Al composition C43AL.

According to the vertical cavity surface emitting laser 11, the first minimum Al composition C1MN37 greater than the first Al composition C41AL of the first laminate 33 is applied to the first compound semiconductor layer 37 adjacent to the current confinement structure 35. In the first compound semiconductor layer 37, the first aluminum profile PF1 changes monotonously from this first minimum Al composition C1MN37 in the direction from the first laminate 33 to the current confinement structure 35. The Al composition C39AL greater than the first Al composition C41AL and equivalent to or smaller than the first minimum Al composition C1MN37 is applied to the second compound semiconductor layer 39 adjacent to both the first laminate 33 and the first compound semiconductor layer 37. The first compound semiconductor layer 37 and the second compound semiconductor layer 39 make it possible to avoid a differential resistance in the vertical cavity surface emitting laser 11 being highly dependent on unevenness in size of the current aperture.

The first aluminum profile PF1 has the first maximum Al composition C1MX37 on a boundary surface between the current aperture 35a and the first compound semiconductor layer 37. The first maximum Al composition C1MX37 is greater than the Al composition C39AL of the second compound semiconductor layer 39.

In addition, the III-V compound semiconductor containing aluminum as a Group III constituent element has a bandgap increasing in accordance with increase in the Al composition. A significant bandgap generates a significant specific resistance. However, when the Al composition C39AL greater than the first Al composition C41AL is applied to the second compound semiconductor layer 39, it is effective in reducing the differential resistance in the vertical cavity surface emitting laser 11. Specifically, the second compound semiconductor layer 39 having the Al composition C39AL of 0.25 or greater applies a low differential resistance to the vertical cavity surface emitting laser 11. In addition, the Al composition C39AL of the second compound semiconductor layer 39 can be 0.3 or greater.

The Al composition C39AL of the second compound semiconductor layer 39 may as well be greater than half the difference between the second Al composition C43AL and the first Al composition C41AL "(C43AL-C41AL)/2".

The first minimum Al composition C1MN37 of 0.25 or greater may as well be applied to the first compound semiconductor layer 37. In the III-V compound semiconductor containing aluminum as a Group III constituent element, a bandgap increases in accordance with increase in the Al composition. Increase in bandgap causes increase in specific resistance. However, the first compound semiconductor layer 37 having the first minimum Al composition C1MN37 of 0.25 or greater applies a low differential resistance to the vertical cavity surface emitting laser 11. In addition, the first minimum Al composition C1MN37 of 0.3 or greater may as well be applied to the first compound semiconductor layer 37.

The first minimum Al composition C1MN37 of 0.75 or smaller may as well be applied to the first compound semiconductor layer 37. According to the first minimum Al composition C1MN37 of 0.75 or smaller, it is possible to avoid noticeable deterioration in reflectance in an upper distributed Bragg reflector including the first laminate 33, the current confinement structure 35, the first compound semiconductor layer 37, and the second compound semiconductor layer 39. In addition, the first minimum Al composition C1MN37 of 0.70 or smaller may as well be applied to the first compound semiconductor layer 37.

The first minimum Al composition C1MN37 of the first compound semiconductor layer 37 may as well be greater than half the difference between the second Al composition C43AL and the first Al composition C41AL "(C43AL-C41AL)/2". According to the vertical cavity surface emitting laser 11, the first compound semiconductor layer 37 having a small range in the Al composition gradient and the second compound semiconductor layer having a significant Al composition are effective in reducing the differential resistance.

With reference to FIG. 1, in the current confinement structure 35, the first compound semiconductor layer 37, and the second compound semiconductor layer 39, the first aluminum profile PF1 is continuously formed regarding the coordinates on the first axis Ax1. Specifically, the Al composition C39AL of the second compound semiconductor layer 39 may be equivalent to the first minimum Al composition C1MN37 of the first compound semiconductor layer 37. The Al composition CAPAL of the current aperture 35a may be equivalent to the first maximum Al composition C1MX37 of the first compound semiconductor layer 37. The first aluminum profile PF1 changes monotonously in the first compound semiconductor layer 37. Specifically, the differential coefficient of the first aluminum profile PF1 is zero or greater in the first compound semiconductor layer 37 and is greater than zero in at least a part of the first compound semiconductor layer 37 (alternatively, the differential coefficient of the first aluminum profile PF1 is zero or smaller in the first compound semiconductor layer 37 and is smaller than zero in at least a part of the first compound semiconductor layer 37).

According to the vertical cavity surface emitting laser 11, a continuous aluminum profile can be provided for arrangement of the current aperture 35a, the first compound semiconductor layer 37, and the second compound semiconductor layer 39.

In addition, due to the first minimum Al composition C1MN37 and the Al composition C39AL greater than 0.25, the differential resistance becomes insensitive to unevenness in size of the current aperture.

In the present Example, the absolute value for the difference (CAPAL-C39AL) between the Al compositions in the current aperture 35a of the current confinement structure 35 and the second compound semiconductor layer 39 is smaller than the absolute value for the difference (C43AL-C41AL) between the Al compositions of the second semiconductor layer 43 and the first semiconductor layer 41 in the first laminate 33.

In the present Example, the first laminate 33 manifests a rapid change in the Al composition on a boundary surface between the first semiconductor layer 41 and the second semiconductor layer 43.

According to the vertical cavity surface emitting laser 11, fluctuation in differential resistance with respect to change in size of the current aperture is reduced due to a significant Al composition of the second compound semiconductor layer 39 adjacent to the first laminate 33 and the current confinement structure 35, and a gentle composition gradient of the first compound semiconductor layer 37.

With reference to FIG. 1, the vertical cavity surface emitting laser 11 further includes a second laminate 45, a third compound semiconductor layer 57, and a fourth compound semiconductor layer 59. The second laminate 45, the third compound semiconductor layer 57, and the fourth compound semiconductor layer 59 are provided inside the post 17. The second laminate 45, the fourth compound semiconductor layer 59, the third compound semiconductor layer 57, the current confinement structure 35, the first compound semiconductor layer 37, the second compound semiconductor layer 39, and the first laminate 33 are arranged in the direction of the first axis Ax1.

The second laminate 45 includes first semiconductor layers 51 and second semiconductor layers 53 which are arranged alternately for distributed Bragg reflection. Each of the first semiconductor layers 51 has the third III-V semiconductor having a third Al composition C51AL. Each of the second semiconductor layers 53 has the fourth III-V semiconductor having a fourth Al composition C53AL greater than the third Al composition C51AL.

The third compound semiconductor layer 57 comes into contact with the current confinement structure 35 between the second laminate 45 and the current confinement structure 35. The fourth compound semiconductor layer 59 comes into contact with the second laminate 45 and the third compound semiconductor layer 57 between the second laminate 45 and the third compound semiconductor layer 57. Each of the third compound semiconductor layer 57 and the fourth compound semiconductor layer 59 contains elemental aluminum as a Group III constituent element.

The third compound semiconductor layer 57 has an Al composition C57AL defined on the first axis Ax1. The Al composition C57AL changes monotonously from a second minimum Al composition C2MN57 to a second maximum Al composition C2MX57 in a direction from the second laminate 45 to the current confinement structure 35. The second maximum Al composition C2MX57 is greater than the second minimum Al composition C2MN57.

A second aluminum profile PF2 has the second maximum Al composition C2MX57 on a boundary surface between the current aperture 35a and the third compound semiconductor layer 57 and is equivalent to the Al composition CAPAL of the current aperture 35a in the present Example. The second maximum Al composition C2MX57 is greater than an Al composition C59AL of the fourth compound semiconductor layer 59.

If possible, the second minimum Al composition C2MN57 of the third compound semiconductor layer 57 can be 0.25 or greater, and the second minimum Al composition C2MN57 of the third compound semiconductor layer 57 can be 0.75 or smaller.

In addition, the third compound semiconductor layer 57 can come into contact with the second laminate 45.

Moreover, the second minimum Al composition C2MN57 can be equivalent to the third Al composition C51AL on a boundary surface between the third compound semiconductor layer 57 and the second laminate 45. The second aluminum profile PF2 is continuously formed in the current aperture 35a and the third compound semiconductor layer 57.

If necessary, the second minimum Al composition C2MN57 can be within a range greater than the third Al composition C51AL and smaller than the fourth Al composition C53AL.

The fourth compound semiconductor layer 59 has the Al composition C59AL greater than the third Al composition C51AL and equivalent to or smaller than the second minimum Al composition C2MN57. The fourth Al composition C53AL is smaller than the Al composition CAPAL of the III-V compound semiconductor of the current aperture 35a.

According to the vertical cavity surface emitting laser 11, the second minimum Al composition C2MN57 greater than the third Al composition C51AL of the second laminate 45 is applied to the third compound semiconductor layer 57 adjacent to the current confinement structure 35. The second aluminum profile PF2 changes monotonously from this second minimum Al composition C2MN57 in the direction from the second laminate 45 to the current confinement structure 35. The Al composition C59AL greater than the third Al composition C51AL and equivalent to or smaller than the second minimum Al composition C2MN57 is applied to the fourth compound semiconductor layer 59 adjacent to the second laminate 45 and the third compound semiconductor layer 57. In the present Example, the Al composition C59AL can be substantially uniform. The third compound semiconductor layer 57 and the fourth compound semiconductor layer 59 make it possible to avoid a differential resistance in the vertical cavity surface emitting laser 11 being highly dependent on unevenness in size of the current aperture.

In addition, the III-V compound semiconductor containing aluminum as a Group III constituent element has a bandgap increasing in accordance with increase in the Al composition. A significant bandgap generates a significant specific resistance. However, when the Al composition C59AL greater than the third Al composition C51AL is applied to the fourth compound semiconductor layer 59, it is effective in reducing the differential resistance in the vertical cavity surface emitting laser 11. Specifically, the fourth compound semiconductor layer 59 having the Al composition C59AL of 0.25 or greater applies a low differential resistance to the vertical cavity surface emitting laser 11. In addition, the Al composition C59AL of the fourth compound semiconductor layer 59 can be 0.3 or greater.

The Al composition C59AL of the fourth compound semiconductor layer 59 may as well be greater than half the difference between the third Al composition C51AL and the fourth Al composition C53AL "(C53AL-C51AL)/2".

In the present Example, the second laminate 45 manifests a rapid change in the Al composition on a boundary surface between the first semiconductor layer 51 and the second semiconductor layer 53.

The second minimum Al composition C2MN57 of 0.25 or greater may as well be applied to the third compound semiconductor layer 57. In the III-V compound semiconductor containing aluminum as a Group III constituent element, a bandgap increases in accordance with increase in the Al composition. Increase in bandgap causes increase in specific resistance. However, the third compound semiconductor layer 57 having the second minimum Al composition C2MN57 of 0.25 or greater applies a low differential resistance to the vertical cavity surface emitting laser 11.

The second minimum Al composition C2MN57 of 0.75 or smaller may as well be applied to the third compound semiconductor layer 57. According to the second minimum Al composition C2MN57 of 0.75 or smaller, it is possible to avoid noticeable deterioration in reflectance in an upper distributed Bragg reflector DBRU including the first laminate 33, the second compound semiconductor layer 39, the first compound semiconductor layer 37, the current confinement structure 35, the fourth compound semiconductor layer 59, the third compound semiconductor layer 57, and the second laminate 45.

The second minimum Al composition C2MN57 of the third compound semiconductor layer 57 may as well be greater than half the difference between the fourth Al composition C53AL and the third Al composition C51AL "(C53AL-C51AL)/2". According to the vertical cavity surface emitting laser 11, a small composition range in the Al composition gradient of the third compound semiconductor layer 57 and the fourth compound semiconductor layer 59 having a significant Al composition are effective in reducing the differential resistance.

With reference to FIG. 1, in the current confinement structure 35, the third compound semiconductor layer 57, and the fourth compound semiconductor layer 59, the second aluminum profile PF2 is continuously formed in the coordinates on the first axis Ax1. Specifically, the Al composition C59AL of the fourth compound semiconductor layer 59 is equivalent to the second minimum Al composition C2MN57 of the third compound semiconductor layer 57. The Al composition CAPAL of the current aperture 35a is equivalent to the second maximum Al composition C2MX57 of the third compound semiconductor layer 57. The second aluminum profile PF2 decreases in the third compound semiconductor layer 57 in a direction from the current aperture 35a to the second laminate 45. The differential coefficient of the second aluminum profile PF2 is zero or smaller in the third compound semiconductor layer 57 and is smaller than zero in at least a part of the third compound semiconductor layer 57 (alternatively, the differential coefficient of the second aluminum profile PF2 is zero or greater in the third compound semiconductor layer 57 and is greater than zero in at least a part of the third compound semiconductor layer 57).

According to the vertical cavity surface emitting laser 11, a continuous aluminum profile can be provided for arrangement of the current aperture 35a, the third compound semiconductor layer 57, and the fourth compound semiconductor layer 59.

In addition, due to the second minimum Al composition C2MN57 greater than 0.25 and the significant Al composition C59AL, the differential resistance becomes insensitive to unevenness in size of the current aperture 35a.

In the present Example, the absolute value for the difference (CAPAL-C59AL) between the Al compositions in the current aperture 35a of the current confinement structure 35 and the fourth compound semiconductor layer 59 is smaller than the absolute value for the difference (C53AL-C51AL) between the Al compositions of the second semiconductor layer 53 and the first semiconductor layer 51 in the second laminate 45.

According to the vertical cavity surface emitting laser 11, fluctuation in differential resistance with respect to change in size of the current aperture is reduced due to a significant Al composition of the fourth compound semiconductor layer 59 adjacent to the second laminate 45 and the current confinement structure 35, and a gentle composition gradient of the third compound semiconductor layer 57.

With reference to FIG. 1, the vertical cavity surface emitting laser 11 can further include a contact layer 61 which is the uppermost layer of the post 17. The contact layer 61 includes the III-V compound semiconductor, and a first electrode 21 comes into contact therewith.

The contact layer 61, the first laminate 33, the second compound semiconductor layer 39, the first compound semiconductor layer 37, the current confinement structure 35, the third compound semiconductor layer 57, the fourth compound semiconductor layer 59, and the second laminate 45 include a p-type dopant.

According to the vertical cavity surface emitting laser 11, the contact layer 61, the first laminate 33, the second compound semiconductor layer 39, the first compound semiconductor layer 37, the current confinement structure 35, the third compound semiconductor layer 57, the fourth compound semiconductor layer 59, and the second laminate 45 are positioned on a path of a hole flow.

The vertical cavity surface emitting laser 11 can further include a third laminate 63, and the active layer 31 is provided between the second laminate 45 and the third laminate 63. The third laminate 63 includes first semiconductor layers 71 and second semiconductor layers 73 which are arranged alternately for distributed Bragg reflection. Each of the first semiconductor layers 71 has a fifth III-V semiconductor having a first Al composition C71AL. Each of the second semiconductor layers 73 has a sixth III-V semiconductor having a second Al composition C73AL greater than the first Al composition C71AL. The third laminate 63 constitutes a lower distributed Bragg reflector DBRL.

In the present Example, the third laminate 63 manifests a rapid change in the Al composition on a boundary surface between the first semiconductor layer 71 and the second semiconductor layer 73.

The third laminate 63 can include an n-type dopant. According to the vertical cavity surface emitting laser 11, the third laminate 63 is positioned on a path of an electron flow. The third laminate 63, the active layer 31, the second laminate 45, the fourth compound semiconductor layer 59, the third compound semiconductor layer 57, the current confinement structure 35, the first compound semiconductor layer 37, the second compound semiconductor layer 39, the first laminate 33, and the contact layer 61 are arranged in the direction of the first axis Ax1.

The active layer 31 can include a quantum well structure MQW. The quantum well structure MQW can include one or more well layers 31a and one or more barrier layers 31b. If necessary, the active layer 31 can include a first spacer layer 31c and a second spacer layer 31d outside all of the well layers 31a of the quantum well structure MQW. The first spacer layer 31c is provided between the quantum well structure MQW and the second laminate 45. The second spacer layer 31d is provided between the quantum well structure MQW and the third laminate 63.

The post 17 includes a first part 17c and a second part 17d. The first part 17c and the second part 17d extend in a direction intersecting a main surface 13a of a support 13 (for example, the direction of the first axis Ax1). The first part 17c of the post 17 includes the current aperture 35a. The second part 17d of the post 17 includes the current blocker 35b having insulating properties. In the present Example, the first part 17c of the post 17 is constituted of a semiconductor, and the second part 17d of the post 17 is constituted of a semiconductor and oxide of a constituent element of the semiconductor. The region of the oxide of the second part 17d surrounds regions of the first part 17c and the semiconductor of the second part 17d.

The vertical cavity surface emitting laser 11 includes the support 13, a semiconductor laminate 15, the post 17, the first electrode 21, a second electrode 23, and a coating film 25. The support 13 is equipped with the semiconductor laminate 15, and the semiconductor laminate 15 is equipped with the post 17. The post 17 has an upper surface 17a and a side surface 17b. The coating film 25 covers the upper surface 17a and the side surface 17b of the post 17, and the semiconductor laminate 15. The first electrode 21 comes into contact with the post 17 via a first opening of the coating film 25. The second electrode 23 comes into contact with the support 13 or the semiconductor laminate 15. The active layer 31 is provided between the upper distributed Bragg reflector DBRU and the lower distributed Bragg reflector DBRL, and the support 13.

Example of vertical cavity surface emitting laser 11

Support 13: n-type GaAs

Third laminate 63 (first semiconductor layers 71/second semiconductor layers 73): Si-doped AlGaAs (Al composition: 0.12)/Si-doped AlGaAs (Al composition: 0.90), steep bonding of Al compositions Emission wavelength of active layer 31: 850 to 910 nm Well layers 31a: undoped GaAs Barrier layers 31b: undoped AlGaAs First spacer layer 31c and second spacer layer 31d: AlGaAs Second laminate 45 (first semiconductor layers 51/second semiconductor layers 53): carbon (C)-doped AlGaAs (Al composition: 0.12)/carbon (C)-doped AlGaAs (Al composition: 0.90), steep bonding of Al compositions Third compound semiconductor layer 57: carbon-doped AlGaAs having Al composition gradient (Al composition gradient: 0.25 to 0.98)

Fourth compound semiconductor layer 59: carbon-doped AlGaAs (Al composition: Al composition within range of 0.25 to 0.75)

Current confinement structure 35 (current aperture 35a/current blocker 35b): carbon-doped AlGaAs (Al composition: 0.98)/Group III oxide First compound semiconductor layer 37: carbon-doped AlGaAs having Al composition gradient (Al composition gradient: lower limit for range of 0.25 to 0.75, and upper limit equivalent to CAPAL (for example, 0.98))

Second compound semiconductor layer 39: Al composition having carbon-doped AlGaAs (Al composition: Al composition within range of 0.25 to 0.75)

First laminate 33 (first semiconductor layers 41/second semiconductor layers 43): carbon-doped AlGaAs (Al composition: 0.12)/carbon-doped AlGaAs (Al composition: 0.90), steep bonding of Al compositions Contact layer 61: carbon-doped GaAs or AlGaAs For example, the current aperture 35a of the current confinement structure 35 has a circular shape in a plane perpendicular to the first axis Ax1.

With reference to FIGS. 2 to 6, Examples 1 to 4 according to the embodiment and an experimental example will be described. In Examples 1 to 4, at least one of the first compound semiconductor layer 37 and the third compound semiconductor layer 57 has an aluminum profile changing linearly, and at least one of the second compound semiconductor layer 39 and the fourth compound semiconductor layer 59 has a certain Al composition within a range of 0.25 to 0.75. The aluminum profile is continuously formed throughout the second compound semiconductor layer 39, the first compound semiconductor layer 37, the current aperture 35a, the third compound semiconductor layer 57, and the fourth compound semiconductor layer 59.

EXPERIMENTAL EXAMPLE

Figure 2:
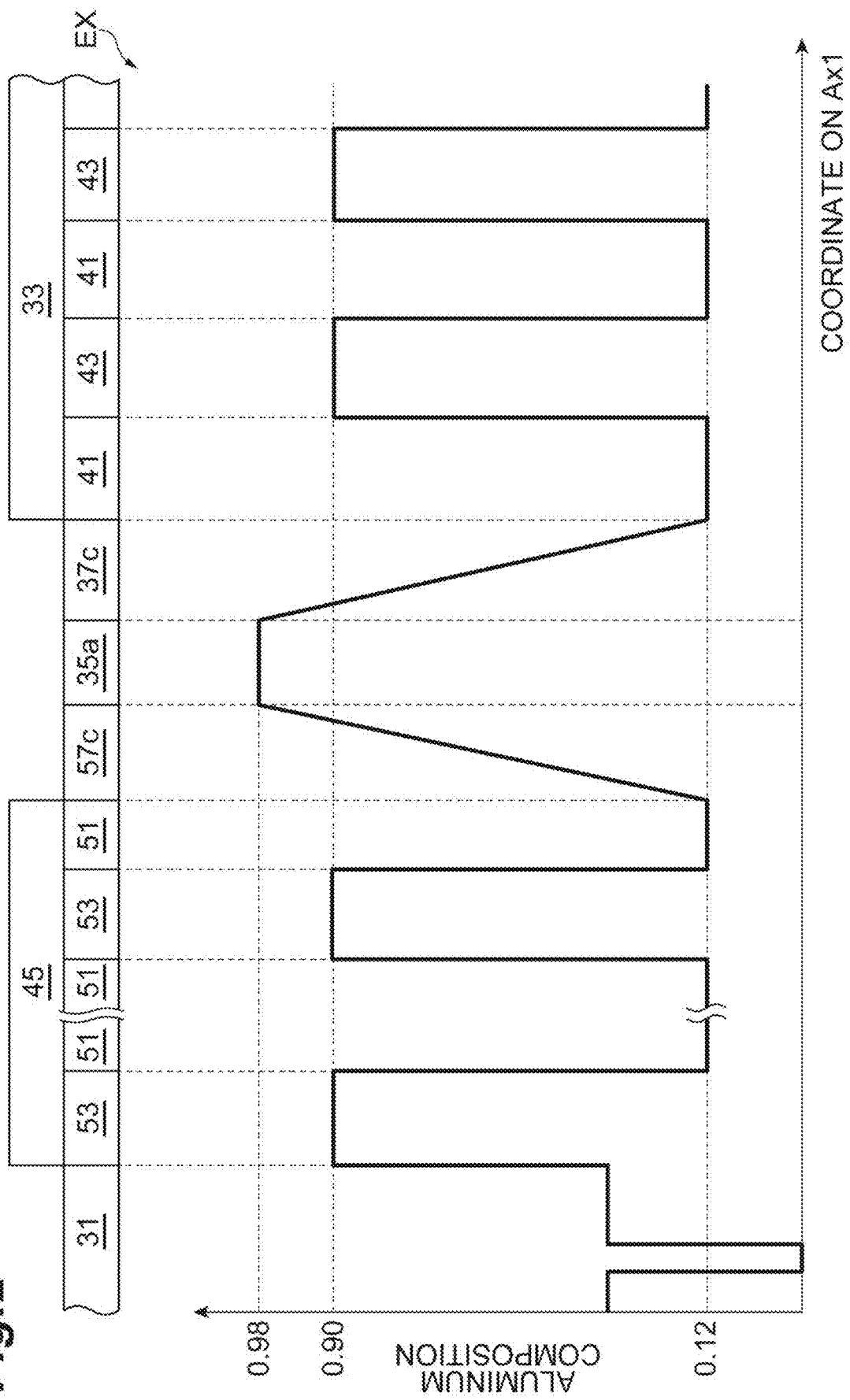
FIG. 2 is a diagram illustrating a structure of a vertical cavity surface emitting laser according to an experimental example.

FIG. 2 illustrates a structure of a vertical cavity surface emitting laser EX according to the experimental example.

Current aperture 35a of current confinement structure 35: C-doped AlGaAs (Al composition CAPAL: 0.98)

First compound semiconductor layer 37c: C-doped AlGaAs having Al composition gradient (Al composition gradient: 0.12 to 0.98), thickness: 18 nm Third compound semiconductor layer 57c: C-doped AlGaAs having Al composition gradient (composition gradient: 0.12 to 0.98), thickness: 18 nm First laminate 33 (first semiconductor layers 41/second semiconductor layers 43): C-doped AlGaAs (Al composition: 0.12)/C-doped AlGaAs (Al composition: 0.90)

Second laminate 45 (first semiconductor layers 51/second semiconductor layers 53): C-doped AlGaAs (Al composition: 0.12)/C-doped AlGaAs (Al composition: 0.90)

A first compound semiconductor layer 37c is adjacent to the first semiconductor layer 41 of the first laminate 33. A third compound semiconductor layer 57c is adjacent to the first semiconductor layer 51 of the second laminate 45.

In the experimental example, the first laminate 33 and the second laminate 45 come into contact with the first compound semiconductor layer 37c and the third compound semiconductor layer 57c, respectively.

Example 1

Figure 3:
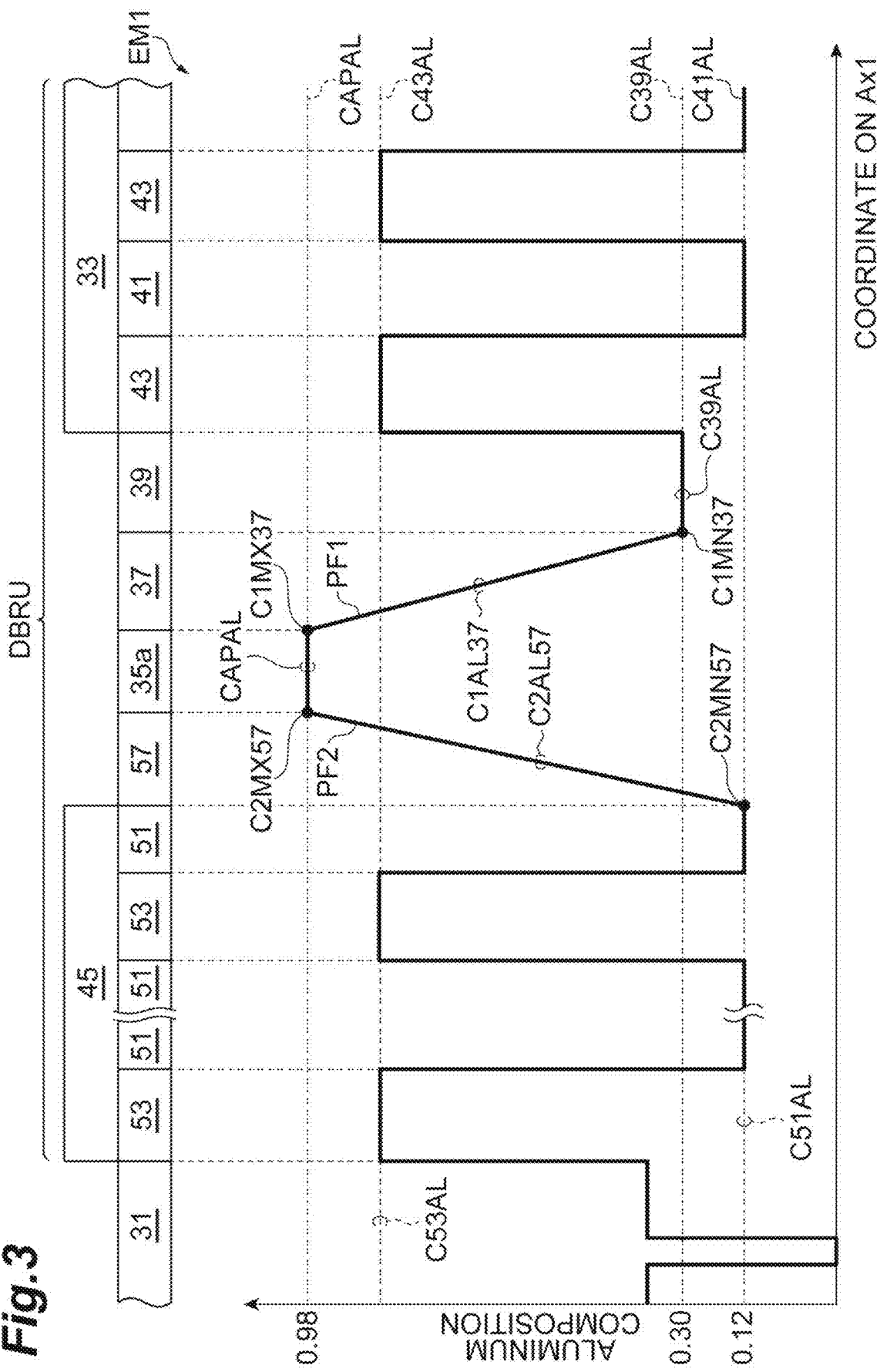
FIG. 3 is a diagram illustrating a structure of a vertical cavity surface emitting laser according to Example 1.

FIG. 3 illustrates a structure of a vertical cavity surface emitting laser EM1 according to Example 1.

Current aperture 35a of current confinement structure 35: carbon-doped AlGaAs (Al composition CAPAL: 0.98)

First compound semiconductor layer 37: carbon-doped AlGaAs having Al composition gradient (composition gradient: 0.30 to 0.98), thickness: 15 to 20 nm Second compound semiconductor layer 39: carbon-doped AlGaAs (Al composition: 0.30), thickness: 15 to 20 nm Third compound semiconductor layer 57: carbon-doped AlGaAs having Al composition gradient (composition gradient: 0.12 to 0.98), thickness: 15 to 20 nm First semiconductor layers 51: carbon-doped AlGaAs (Al composition: 0.12), thickness: 15 to 20 nm Example 2

Figure 4:
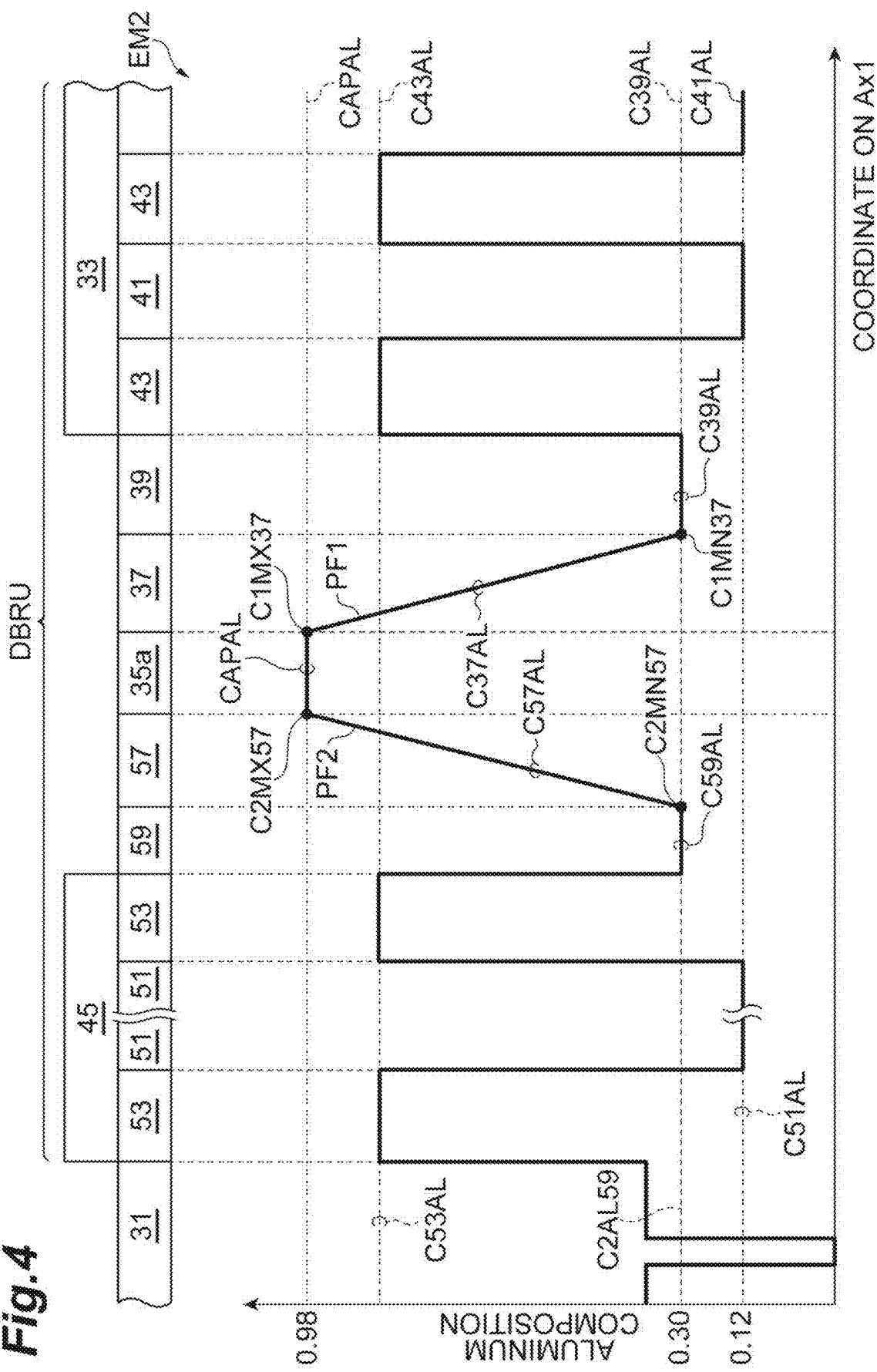
FIG. 4 is a diagram illustrating a structure of a vertical cavity surface emitting laser according to Example 2.

FIG. 4 illustrates a structure of a vertical cavity surface emitting laser EM2 according to Example 2.

Current aperture 35a of current confinement structure 35: carbon-doped AlGaAs (Al composition CAPAL: 0.98)

First compound semiconductor layer 37: carbon-doped AlGaAs having Al composition gradient (composition gradient: 0.30 to 0.98), thickness: 15 to 20 nm Second compound semiconductor layer 39: carbon-doped AlGaAs (Al composition: 0.30), thickness: 15 to 20 nm Third compound semiconductor layer 57: carbon-doped AlGaAs having Al composition gradient (composition gradient: 0.30 to 0.98), thickness: 15 to 20 nm Fourth compound semiconductor layer 59: carbon-doped AlGaAs (Al composition: 0.30), thickness: 15 to 20 nm Example 3

Figure 5:
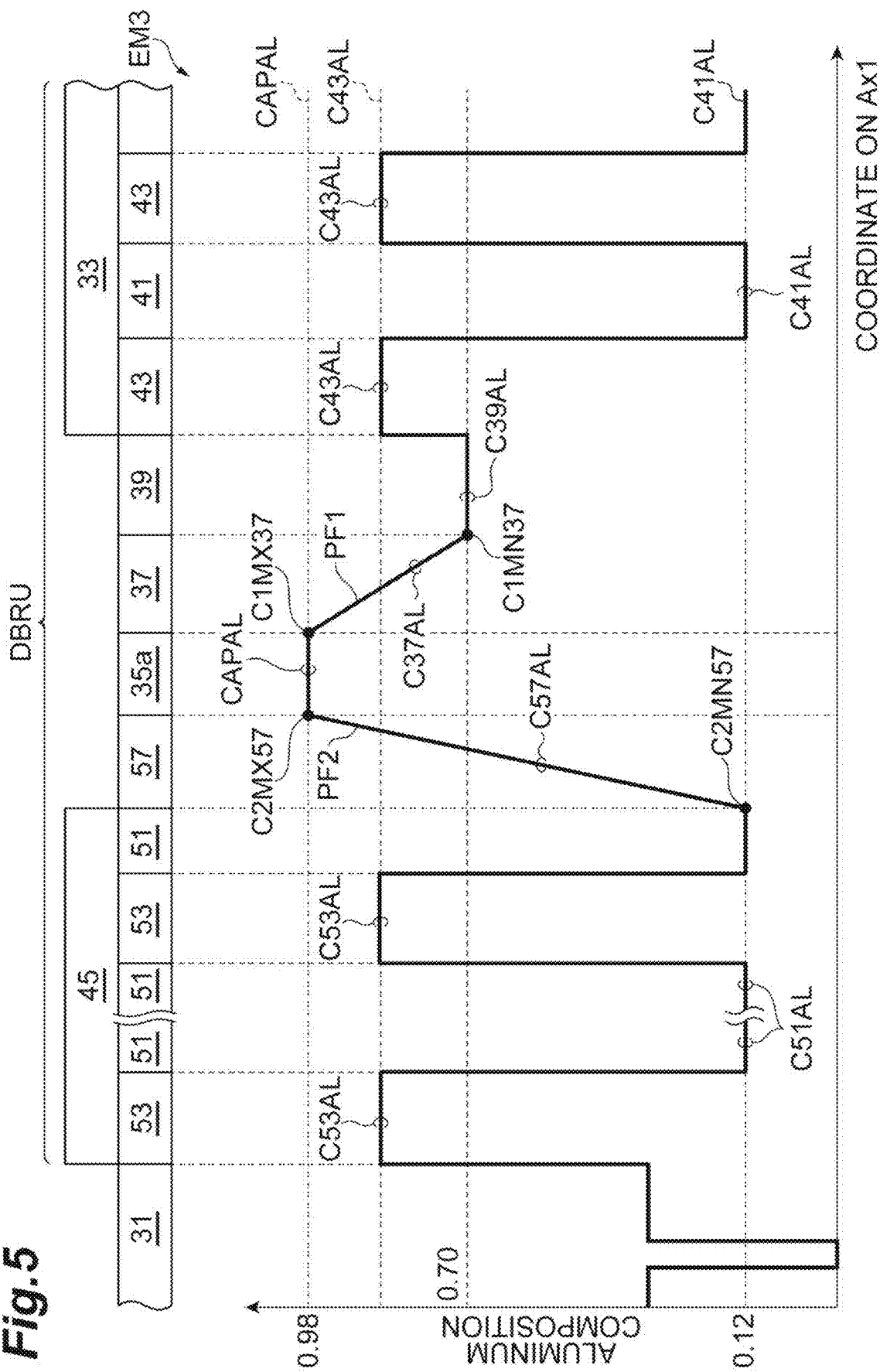
FIG. 5 is a diagram illustrating a structure of a vertical cavity surface emitting laser according to Example 3.

FIG. 5 illustrates a structure of a vertical cavity surface emitting laser EM3 according to Example 3.

Current aperture 35a of current confinement structure 35: carbon-doped AlGaAs (Al composition CAPAL: 0.98)

First compound semiconductor layer 37: carbon-doped AlGaAs having Al composition gradient (composition gradient: 0.70 to 0.98), thickness: 15 to 20 nm Second compound semiconductor layer 39: carbon-doped AlGaAs (Al composition: 0.70), thickness: 15 to 20 nm Third compound semiconductor layer 57: carbon-doped AlGaAs having Al composition gradient (composition gradient: 0.12 to 0.98), thickness: 15 to 20 nm First semiconductor layers 51: carbon-doped AlGaAs (Al composition: 0.12), thickness: 15 to 20 nm Example 4

Figure 6:
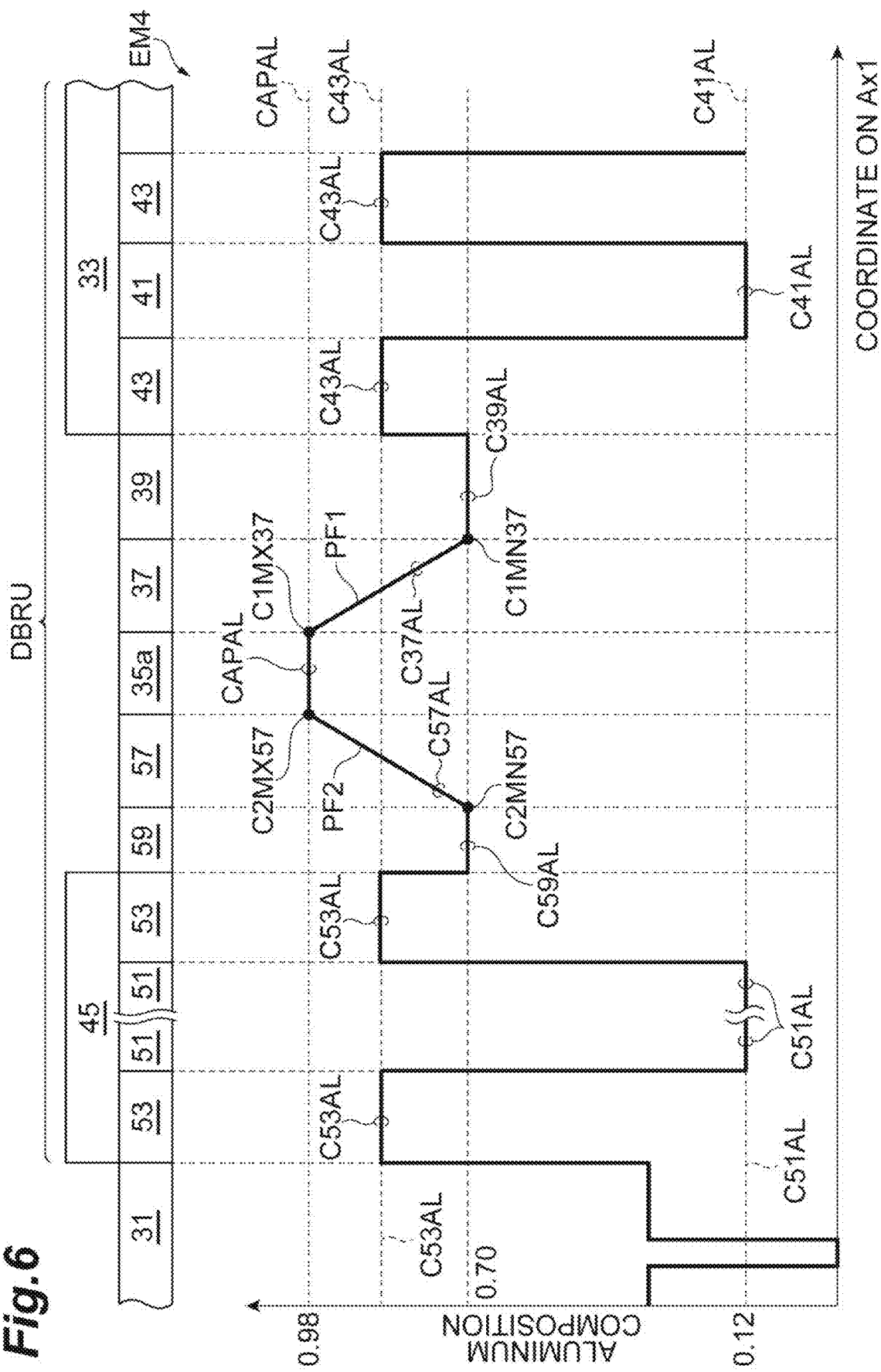
FIG. 6 is a diagram illustrating a structure of a vertical cavity surface emitting laser according to Example 4.

FIG. 6 illustrates a structure of a vertical cavity surface emitting laser EM4 according to Example 4.

Current aperture 35a of current confinement structure 35: carbon-doped AlGaAs (Al composition CAPAL: 0.98)

First compound semiconductor layer 37: carbon-doped AlGaAs having Al composition gradient (composition gradient: 0.70 to 0.98), thickness: 15 to 20 nm Second compound semiconductor layer 39: carbon-doped AlGaAs (Al composition: 0.70), thickness: 15 to 20 nm Third compound semiconductor layer 57: carbon-doped AlGaAs having Al composition gradient (composition gradient: 0.70 to 0.98), thickness: 15 to 20 nm Fourth compound semiconductor layer 59: carbon-doped AlGaAs (Al composition: 0.70), thickness: 15 to 20 nm With reference to FIGS. 7 to 10, Examples 5 to 8 will be described. In Examples 5 to 8, at least one of the first compound semiconductor layer 37 and the third compound semiconductor layer 57 has an aluminum profile changing along a quadratic curve, and at least one of the second compound semiconductor layer 39 and the fourth compound semiconductor layer 59 has a certain Al composition within a range of 0.25 to 0.75. The aluminum profile is continuously formed throughout the second compound semiconductor layer 39, the first compound semiconductor layer 37, the current aperture 35a, the third compound semiconductor layer 57, and the fourth compound semiconductor layer 59. The aluminum profile has a shape projecting upward throughout the first compound semiconductor layer 37 and the current aperture 35a, throughout the current aperture 35a and the third compound semiconductor layer 57, throughout the first compound semiconductor layer 37, the current aperture 35a, and the third compound semiconductor layer 57.

In addition, for example, the peak of the quadratic curve indicating the aluminum profile in the first compound semiconductor layer 37 may as well be positioned on a boundary surface between the first compound semiconductor layer 37 and the current aperture 35a. The peak of the quadratic curve indicating the aluminum profile in the third compound semiconductor layer 57 may as well be positioned on a boundary surface between the third compound semiconductor layer 57 and the current aperture 35a.

Example 5

Figure 7:
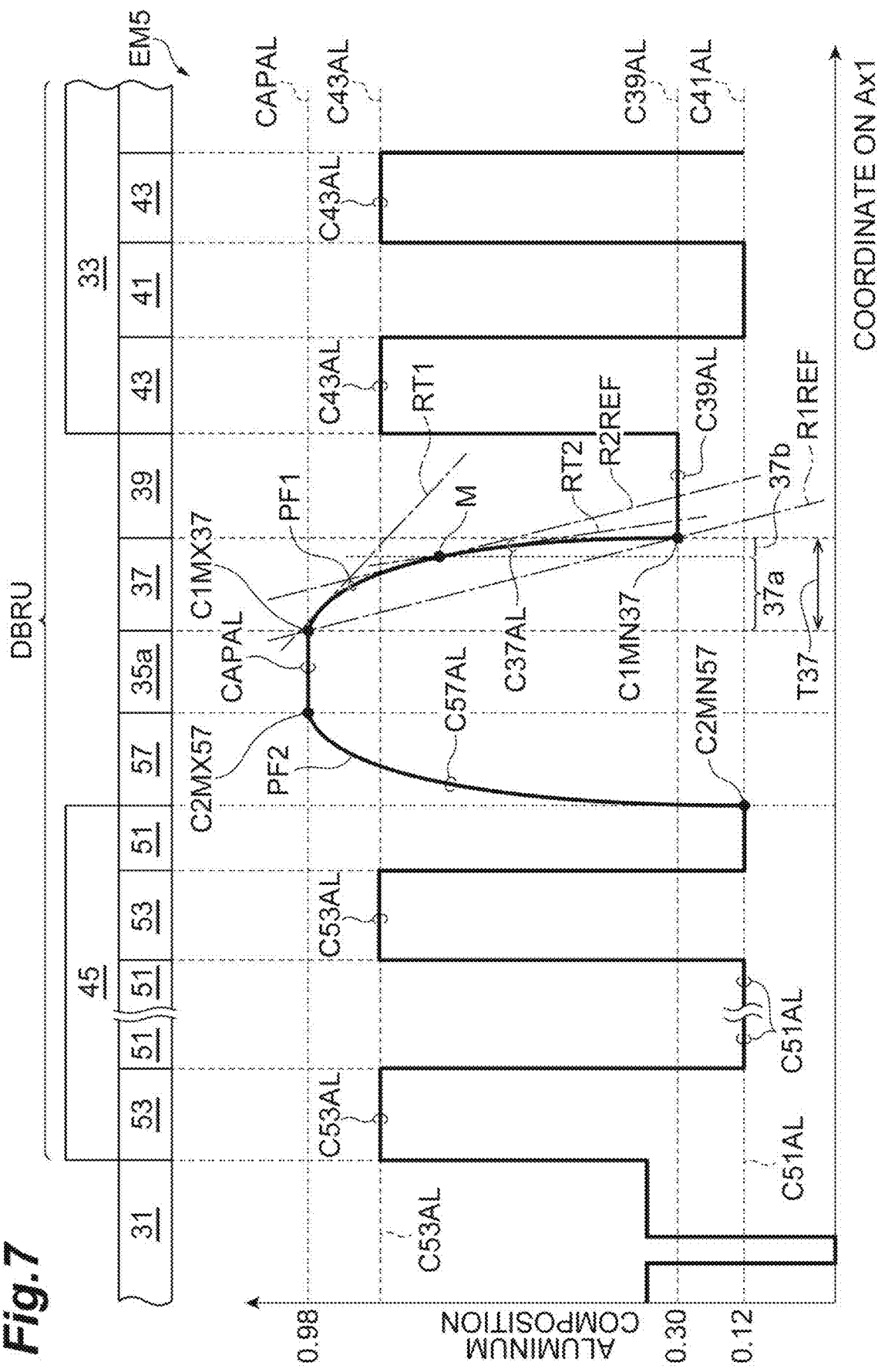
FIG. 7 is a diagram illustrating a structure of a vertical cavity surface emitting laser according to Example 5.

FIG. 7 illustrates a structure of a vertical cavity surface emitting laser EM5 according to Example 5.
Current aperture 35a of current confinement structure 35: carbon-doped AlGaAs (Al composition CAPAL: 0.98)
First compound semiconductor layer 37: carbon-doped AlGaAs having Al composition gradient (composition gradient along quadratic curve: 0.30 to 0.98), thickness: 15 to 20 nm
Second compound semiconductor layer 39: carbon-doped AlGaAs (Al composition: 0.30), thickness: 15 to 20 nm
Third compound semiconductor layer 57: carbon-doped AlGaAs having Al composition gradient (composition gradient along quadratic curve: 0.12 to 0.98), thickness: 15 to 20 nm
First semiconductor layers 51: carbon-doped AlGaAs (Al composition: 0.12), thickness: 15 to 20 nm Example 6

Figure 8:
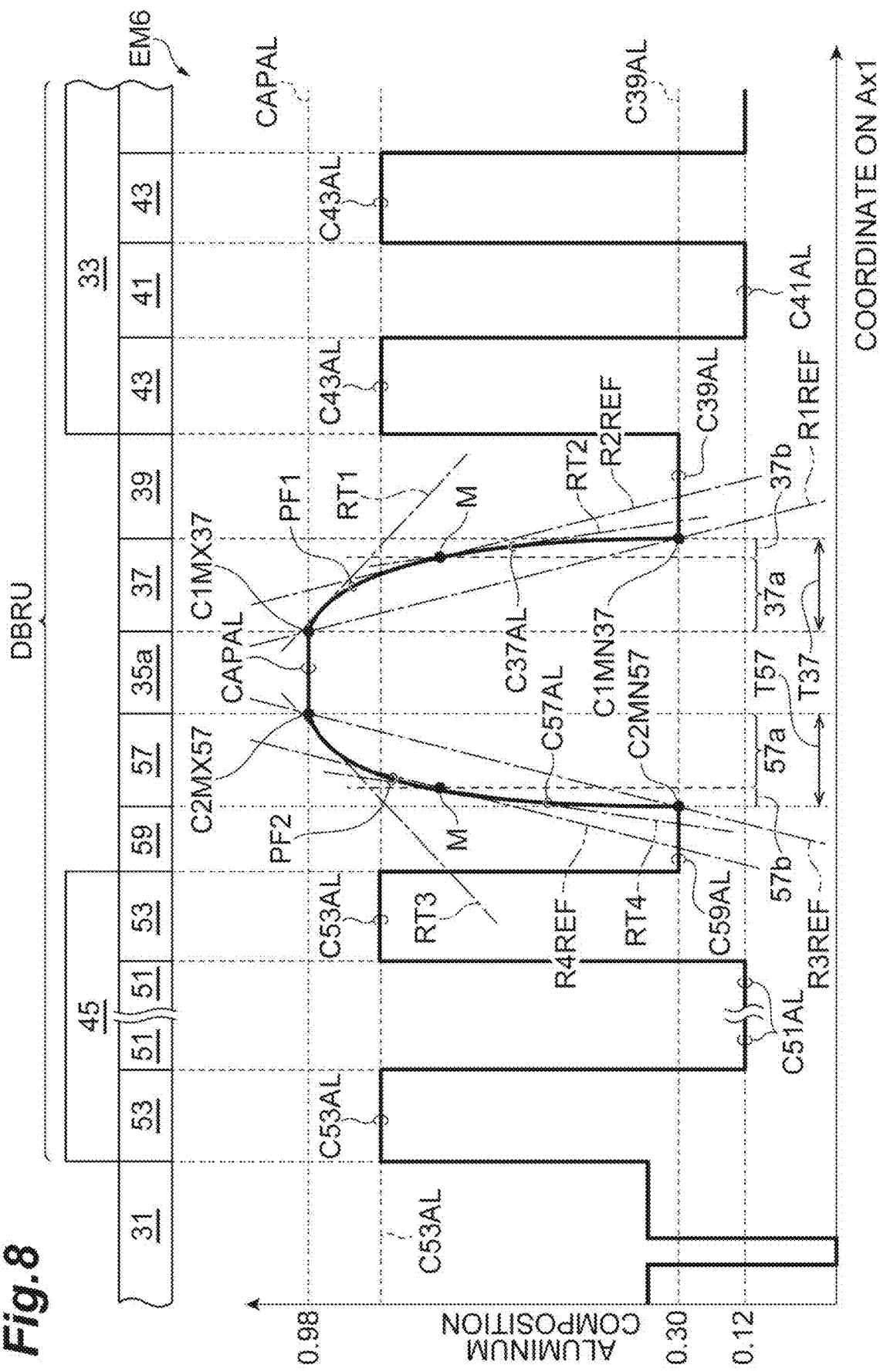
FIG. 8 is a diagram illustrating a structure of a vertical cavity surface emitting laser according to Example 6.

FIG. 8 illustrates a structure of a vertical cavity surface emitting laser EM6 according to Example 6.
Current aperture 35a of current confinement structure 35: carbon-doped AlGaAs (Al composition CAPAL: 0.98)
First compound semiconductor layer 37: carbon-doped AlGaAs having Al composition gradient (composition gradient along quadratic curve: 0.30 to 0.98), thickness: 15 to 20 nm
Second compound semiconductor layer 39: carbon-doped AlGaAs (Al composition: 0.30), thickness: 15 to 20 nm
Third compound semiconductor layer 57: carbon-doped AlGaAs having Al composition gradient (composition gradient along quadratic curve: 0.30 to 0.98), thickness: 15 to 20 nm
Fourth compound semiconductor layer 59: carbon-doped AlGaAs (Al composition: 0.30), thickness: 15 to 20 nm Example 7

Figure 9:
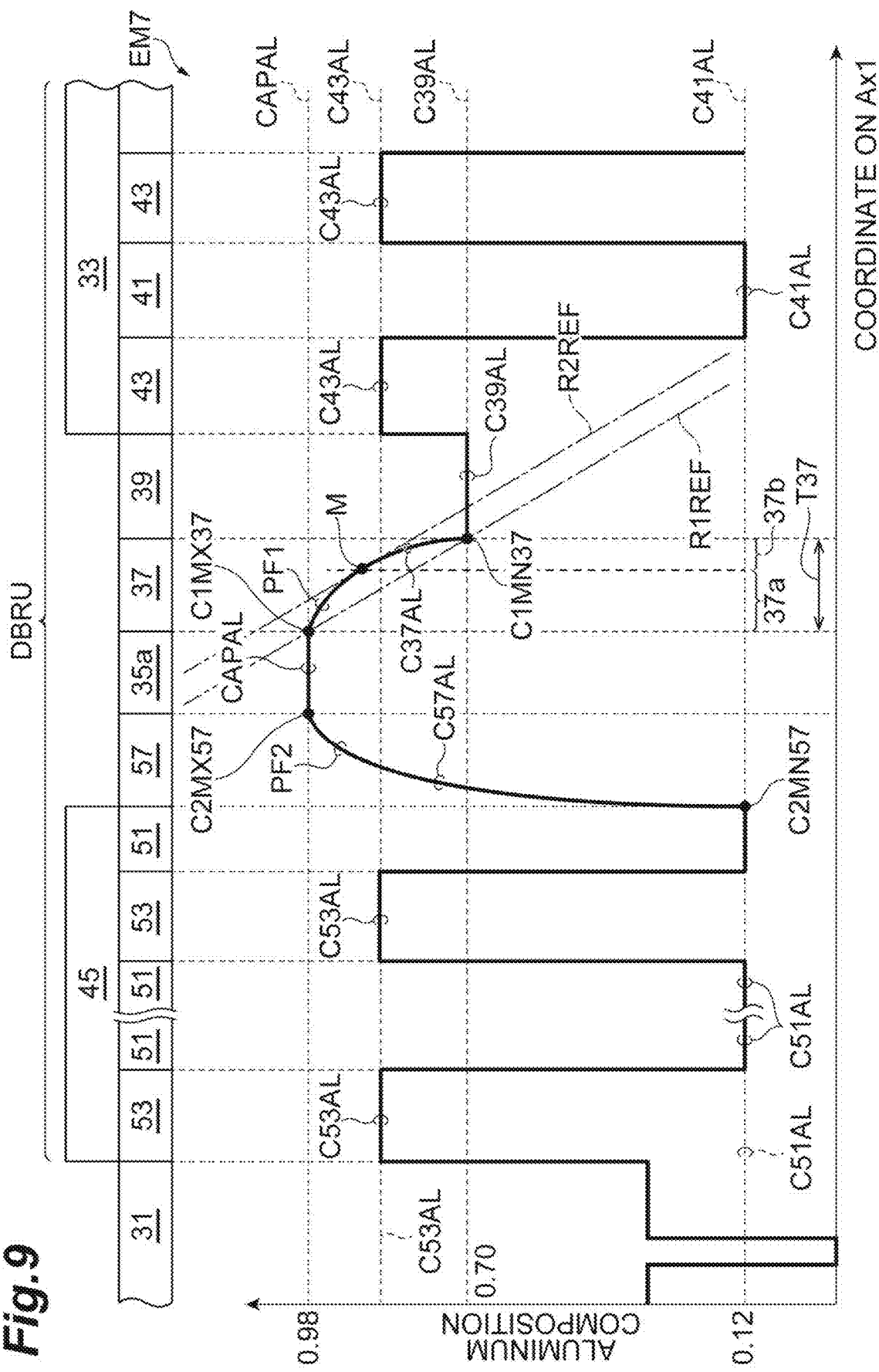
FIG. 9 is a diagram illustrating a structure of a vertical cavity surface emitting laser according to Example 7.

FIG. 9 illustrates a structure of a vertical cavity surface emitting laser EM7 according to Example 7.
Current aperture 35a of current confinement structure 35: carbon-doped AlGaAs (Al composition CAPAL: 0.98)
First compound semiconductor layer 37: carbon-doped AlGaAs having Al composition gradient (composition gradient: 0.70 to 0.98), thickness: 15 to 20 nm
Second compound semiconductor layer 39: carbon-doped AlGaAs (Al composition: 0.70), thickness: 15 to 20 nm
Third compound semiconductor layer 57: carbon-doped AlGaAs having Al composition gradient (composition gradient along quadratic curve: 0.12 to 0.98), thickness: 15 to 20 nm
First semiconductor layers 51: carbon-doped AlGaAs (Al composition: 0.12), thickness: 15 to 20 nm Example 8

Figure 10:
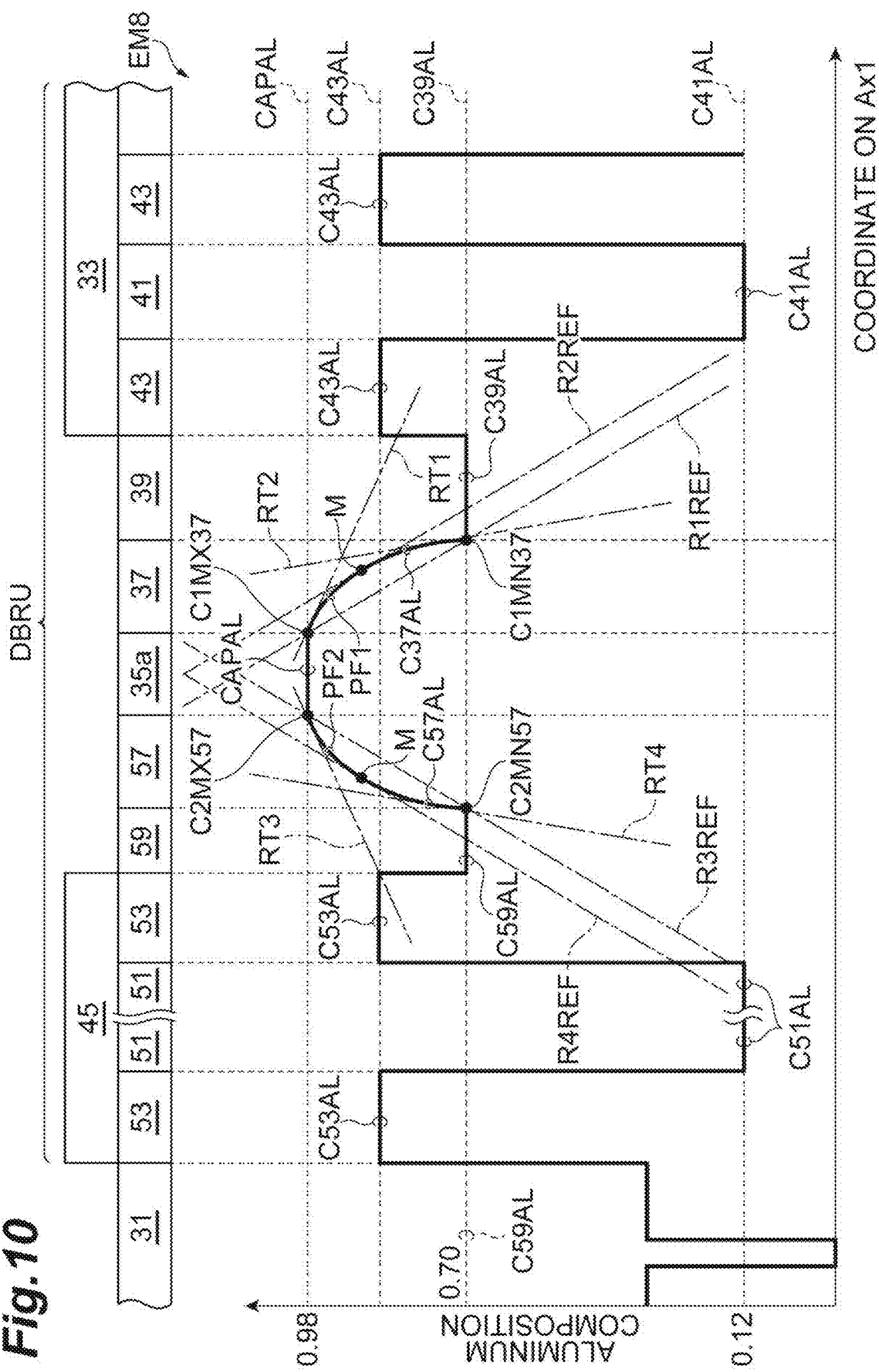
FIG. 10 is a diagram illustrating a structure of a vertical cavity surface emitting laser according to Example 8.

FIG. 10 illustrates a structure of a vertical cavity surface emitting laser EM8 according to Example 8.
Current aperture 35a of current confinement structure 35: carbon-doped AlGaAs (Al composition CAPAL: 0.98)
First compound semiconductor layer 37: carbon-doped AlGaAs having Al composition gradient (composition gradient along quadratic curve: 0.70 to 0.98), thickness: 15 to 20 nm
Second compound semiconductor layer 39: carbon-doped AlGaAs (Al composition: 0.70), thickness: 15 to 20 nm
Third compound semiconductor layer 57: carbon-doped AlGaAs having Al composition gradient (composition gradient along quadratic curve: 0.70 to 0.98), thickness: 15 to 20 nm
Fourth compound semiconductor layer 59: carbon (C)-doped AlGaAs (Al composition: 0.70), thickness: 15 to 20 nm The aluminum profile is not limited to a change along a line shape or a parabola. Specifically, with reference to FIGS. 7 to 10 again, the first compound semiconductor layer 37 can include a first part 37a and a second part 37b which are arranged sequentially in a direction from the current confinement structure 35 to the first laminate 33. The first aluminum profile PF1 has a first change rate RT1 and a second change rate RT2 at arbitrary points inside the first part 37a and the second part 37b of the first compound semiconductor layer 37, respectively. Each of the first change rate RT1 and the second change rate RT2 is defined as a slope of a tangent line which comes into contact with the first aluminum profile PF1 at the corresponding point.

The first part 37a and the second part 37b have the first change rate RT1 and the second change rate RT2 of the first aluminum profile PF1, respectively. The absolute value for the second change rate RT2 is equivalent to or greater than the absolute value for the first change rate RT1. The first change rate RT1 is smaller than the absolute value for a slope of a first reference line R1REF (one-dot chain line indicated in FIGS. 7 to 10) having a linear change rate (C1MX37−C1MN37)/T37 of the difference between the first maximum Al composition C1MX37 and the first minimum Al composition C1MN37 with respect to the thickness (T37) of the first compound semiconductor layer 37. This absolute value for the linear change rate is located between the absolute value for the first change rate RT1 and the absolute value for the second change rate RT2 and is smaller than the absolute value for the second change rate. The absolute value for the first change rate RT1 is smaller than the absolute value for the second change rate RT2.

The first reference line R1REF expresses a gradient composition having a linear change. The first reference line R1REF is moved in parallel such that it comes into contact with the first aluminum profile PF1, and then a second reference line R2REF is defined. The second reference line R2REF comes into contact with the first aluminum profile PF1 at a point M on the first aluminum profile PF1. The point M divides the first compound semiconductor layer 37 into the first part 37a and the second part 37b.

Similar to the first compound semiconductor layer 37, the third compound semiconductor layer 57 is associated with a third reference line R3REF expressing a gradient composition having a linear change, and a fourth reference line R4REF (contact point at the point M) moved in parallel. The third compound semiconductor layer 57 can include a first part 57a and a second part 57b which are arranged sequentially in a direction from the current confinement structure 35 to the second laminate 45. The second aluminum profile PF2 has a third change rate RT3 and a fourth change rate RT4 at arbitrary points inside the first part 57a and the second part 57b of the third compound semiconductor layer 57, respectively. Each of the third change rate RT3 and the fourth change rate RT4 is defined as a slope of a tangent line which comes into contact with the second aluminum profile PF2 at the corresponding point.

The third change rate RT3 is smaller than the absolute value for the third reference line R3REF (one-dot chain line indicated in FIGS. 7 to 10) having a linear change rate (C2MX57−C2MN57)/T57 of the difference between the second maximum Al composition C2MX57 and the second minimum Al composition C2MN57 with respect to the thickness (T57) of the third compound semiconductor layer 57. This absolute value for the linear change rate is located between the absolute value for the third change rate RT3 and the absolute value for the fourth change rate RT4 and is smaller than the absolute value for the fourth change rate RT4. The absolute value for the third change rate RT3 is smaller than the absolute value for the fourth change rate RT4.

Figure 11:
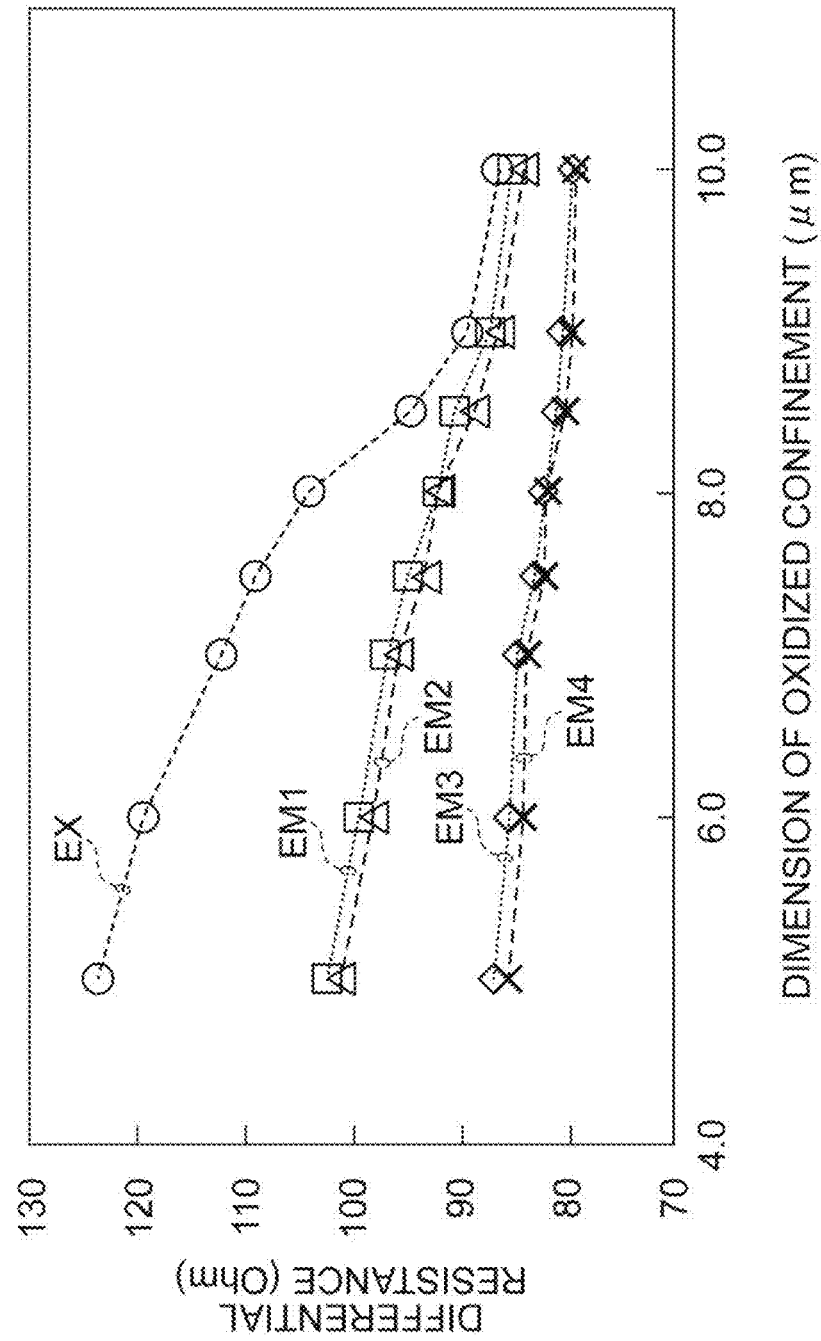
FIG. 11 is a diagram illustrating characteristics of the vertical cavity surface emitting lasers according to the experimental example and Examples 1 to 4.

FIG. 11 illustrates characteristics of the vertical cavity surface emitting laser EX and the vertical cavity surface emitting laser EM1 to the vertical cavity surface emitting laser EM4 according to the experimental example and Examples 1 to 4. The horizontal axis indicates the dimension of the current aperture, and the vertical axis indicates the differential resistance.

In the vertical cavity surface emitting laser EX and the vertical cavity surface emitting laser EM1 to the vertical cavity surface emitting laser EM4 as examples, when the dimension (diameter of the opening) is 8.5 micrometers or smaller, the difference between the differential resistances of the experimental example and Examples 1 to 4 becomes noticeable.

The differential resistance of a semiconductor laser according to the experimental example increases at a significant slope in accordance with decrease in dimension of the current aperture. This indicates that the differential resistance is sensitive to unevenness in dimension of the current aperture. On the other hand, the differential resistance of Examples 1 to 4 increases gently within a range of 10 micrometers to 5 micrometers regarding the dimension of the current aperture, compared to the differential resistance of the semiconductor laser according to the experimental example.

The differential resistances of the semiconductor laser according to Examples 1 and 2 are smaller than the differential resistance of the semiconductor laser according to the experimental example within the range of 10 micrometers to 5 micrometers regarding the dimension of the current aperture. In addition, the differential resistances of the semiconductor laser according to Examples 3 and 4 are smaller than the differential resistance of the semiconductor laser according to Examples 1 and 2 within the range of 10 micrometers to 5 micrometers regarding the dimension of the current aperture.

The differential resistance of the semiconductor laser according to Example 2 is smaller than the differential resistance of the semiconductor laser according to Example 1 within the range of 10 micrometers to 5 micrometers regarding the dimension of the current aperture. In addition, the differential resistance of the semiconductor laser according to Example 4 is smaller than the differential resistance of the semiconductor laser according to Example 3 within the range of 10 micrometers to 5 micrometers regarding the dimension of the current aperture.

The current aperture 35a may as well have a cross-sectional area of 38.5 square micrometers or smaller on a reference surface REF illustrated in FIG. 1. Alternatively, the current aperture 35a may as well have a perimeter of 22.0 micrometers or smaller on the reference surface REF. The current aperture 35a and the current blocker 35b are arranged along the reference surface REF intersecting the first axis Ax1. This reference surface REF is utilized to define the cross-sectional area of the current aperture 35a.

Differential resistance in current aperture diameter (10 micrometers)
Examples 1, 2, 3, and 4, and experimental example
85.1, 84.1, 79.4, 79.1, 86.7

Differential resistance in current aperture diameter (9.0 micrometers)
Examples 1, 2, 3, and 4, and experimental example
87.3, 86.4, 80.5, 79.8, 89.5

Differential resistance in current aperture diameter (8.5 micrometers)
Examples 1, 2, 3, and 4, and experimental example
90.6, 88.7, 81.1, 80.1, 94.5

Differential resistance in current aperture diameter (8.0 micrometers)
Examples 1, 2, 3, and 4, and experimental example
92.1, 92.1, 82.3, 81.9, 104.1

Differential resistance in current aperture diameter (7.5 micrometers)
Examples 1, 2, 3, and 4, and experimental example
94.7, 93.1, 83.2, 82.2, 108.9

Differential resistance in current aperture diameter (7.0 micrometers)
Examples 1, 2, 3, and 4, and experimental example
96.8, 95.7, 84.7, 83.9, 112.3

Differential resistance in current aperture diameter (6.0 micrometers)
Examples 1, 2, 3, and 4, and experimental example
99.5, 98.1, 85.8, 84.2, 119.5

Differential resistance in current aperture diameter (5.0 micrometers)
Examples 1, 2, 3, and 4, and experimental example
102.4, 101.2, 86.9, 85.8, 123.7

Figure 12:
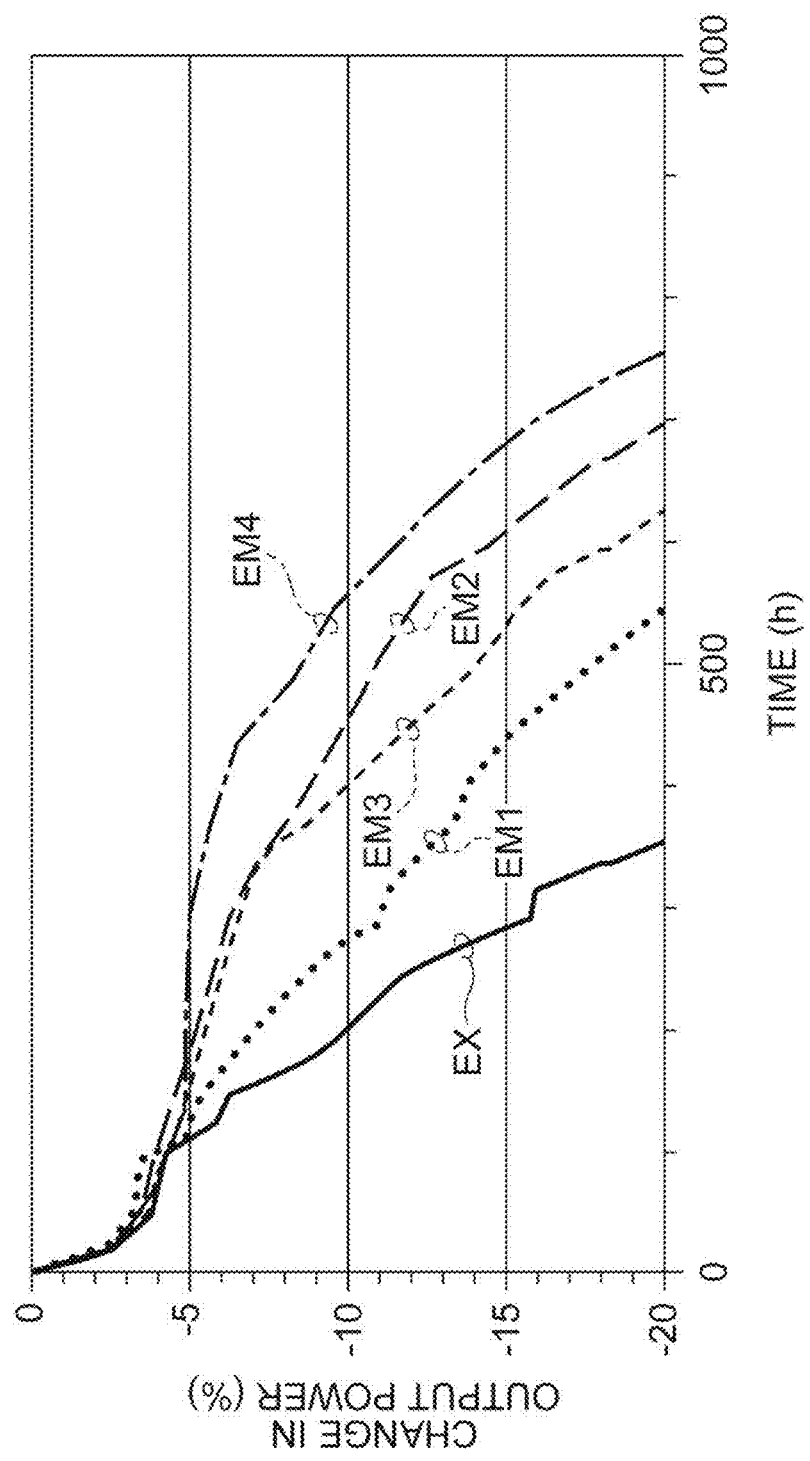
FIG. 12 is a diagram illustrating results of a reliability test of the vertical cavity surface emitting lasers in the experimental example and Examples 1 to 4.
Figure 13:
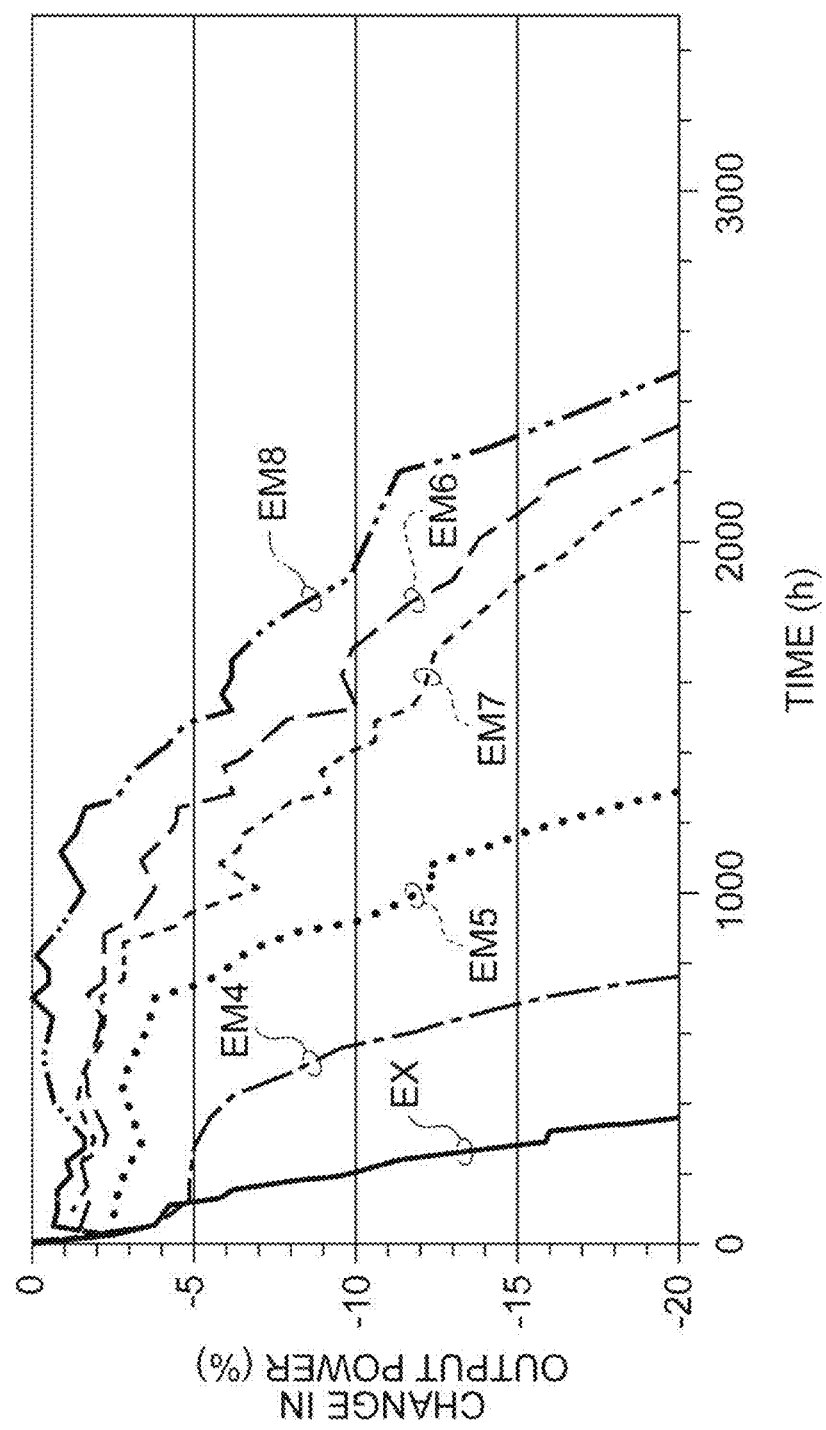
FIG. 13 is a diagram illustrating results of a reliability test of the vertical cavity surface emitting lasers in Examples 5 to 8.

FIGS. 12 and 13 illustrate results of a reliability test of the vertical cavity surface emitting lasers in the experimental example and Examples 1 to 8. In this reliability test, while having the vertical cavity surface emitting lasers of the experimental example EX and Examples 1 to 8 in the atmosphere of 130 degrees Celsius (the same composition as the atmospheric air) under a constant current of 12 milliampere, optical output power of the vertical cavity surface emitting lasers was measured. In FIGS. 12 and 13, the horizontal axis indicates the bias stress duration at a high temperature, and the vertical axis indicates the change in output power.

The lifetimes to failure of the vertical cavity surface emitting lasers were longer sequentially from the experimental example, Example 1, Example 3, Example 2, Example 4, Example 5, Example 7, Example 6, and Example 8, at the level of a change of −15 percent.

When a high Al composition was applied to either the second compound semiconductor layer 39 or the fourth compound semiconductor layer 59, the vertical cavity surface emitting laser tolerated usage for a long period of time.

When a high Al composition was applied to both the second compound semiconductor layer 39 and the fourth compound semiconductor layer 59, the vertical cavity surface emitting laser tolerated usage for a longer period of time.

Compared to a value at a position away from the current aperture 35a, when the Al composition was changed to a small proportion in the first compound semiconductor layer 37 or the third compound semiconductor layer 57 in the vicinity of the current aperture 35a, the vertical cavity surface emitting laser tolerated usage for a longer period of time.

Figure 14:
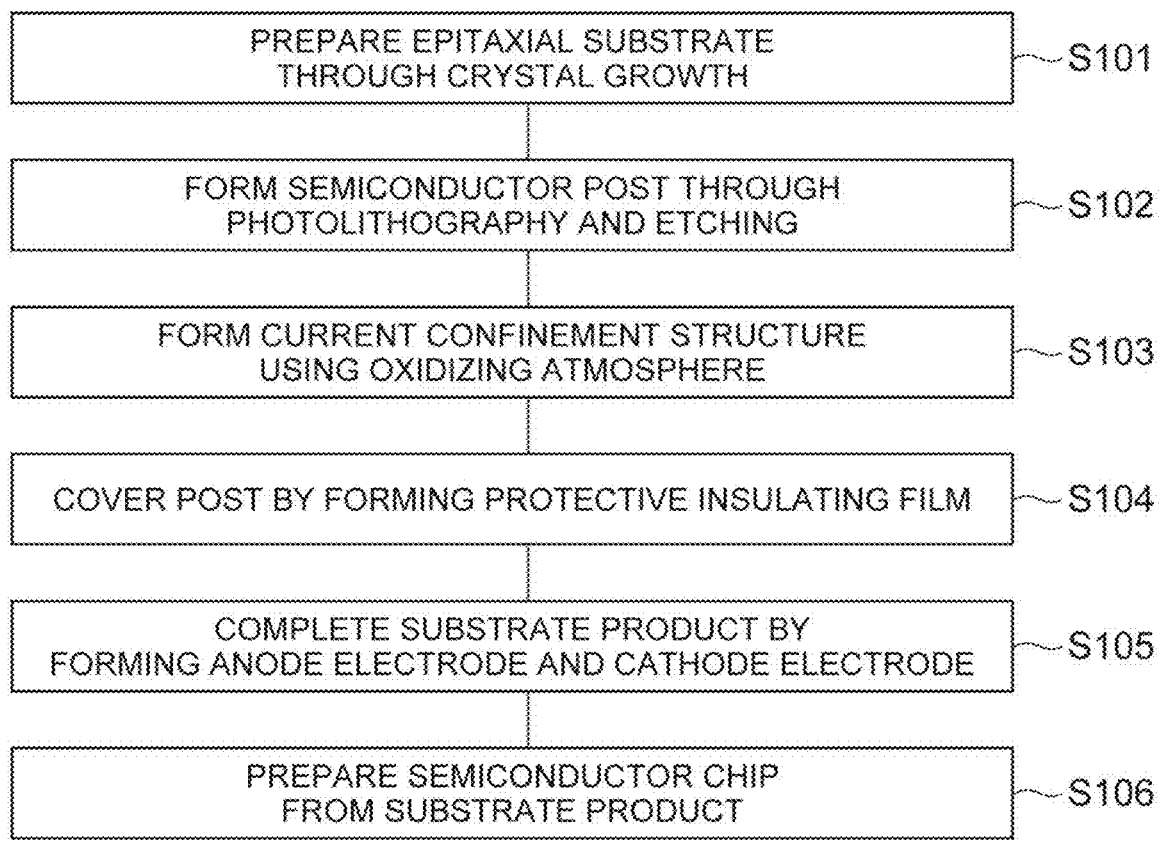
FIG. 14 is a diagram illustrating main steps in a method for preparing a vertical cavity surface emitting laser according to the present embodiment.

FIG. 14 illustrates main steps in a method for preparing a vertical cavity surface emitting laser according to the present embodiment. With reference to a step flow, the method for preparing a vertical cavity surface emitting laser will be described.

In Step S101 of the manufacturing method, a semiconductor laminate including semiconductor layers for a vertical cavity surface emitting laser is grown on an n-type GaAs wafer by metal organic vapor phase epitaxy. As a result, an epitaxial substrate is formed. According to the example of the vertical cavity surface emitting laser 11, the semiconductor laminate includes semiconductor films for the following semiconductor layers: the third laminate 63 (first semiconductor layers 71/second semiconductor layers 73); the active layer 31 (first spacer layer 31c, well layers 31a/barrier layers 31b, second spacer layer 31d); the second laminate 45 (first semiconductor layers 51/second semiconductor layers 53); the fourth compound semiconductor layer 59; the third compound semiconductor layer 57 having an Al composition gradient; the semiconductor of the current aperture 35a of the current confinement structure 35; the first compound semiconductor layer 37 having an Al composition gradient; the second compound semiconductor layer 39; the first laminate 33 (first semiconductor layers 41/second semiconductor layers 43); and the contact layer 61.

When an Al composition gradient layer is grown, a composition-changed aluminum profile can be provided by continuously changing a flow rate controller of a source material line in a crystal growth furnace to change for example Al source material gas for a Group III constituent element. In FIGS. 3 to 6 of Examples 1 to 4, the aluminum profile has a continuous composition gradient expressed by a single linear function. In FIGS. 7 to 10 of Examples 5 to 8, the aluminum profile has a continuous composition gradient expressed by a quadratic function. The aluminum profile can include other composition gradients using various functions such that they substantially project upward.

In Step S102 of the manufacturing method, photolithography and etching are applied to the epitaxial substrate. As a result, a semiconductor post is formed from the semiconductor laminate of the epitaxial substrate. Specifically, a mask for defining the semiconductor post is formed on the epitaxial substrate, and the semiconductor laminate is processed through etching using this mask. In the present Example, the semiconductor post includes a series of semiconductor films in a lower part of the third laminate 63.

In Step S103 of the manufacturing method, the semiconductor post is placed in an oxidizing atmosphere (for example, high-temperature steam). As a result, the semiconductor film having a high Al composition for the current aperture 35a of the current confinement structure 35 is oxidized. Through this oxidation, the post 17 is formed from the semiconductor post. Oxide of the semiconductor film becomes the current blocker 35b, and the remaining semiconductor becomes the current aperture 35a. An Al-containing semiconductor film inside the semiconductor post is oxidized at an oxidation rate corresponding to the Al composition thereof.

In Step S104 of the manufacturing method, an inorganic insulating film for the coating film 25 is deposited on the wafer using the vapor deposition, such that the post 17 is covered.

In Step S105 of the manufacturing method, after the insulating film is grown on the wafer, prior to formation of an electrode, the inorganic insulating film is processed through photolithography and etching. As a result, contact openings are formed in the inorganic insulating film. An anode electrode and a cathode electrode are formed in each of the contact openings using photolithography and metal deposition. Through these steps, a substrate product is completed.

In Step S106 of the manufacturing method, dicing or cleaving is applied to the substrate product. As a result, a semiconductor chip for a vertical cavity surface emitting laser is prepared.

Figure 15A:
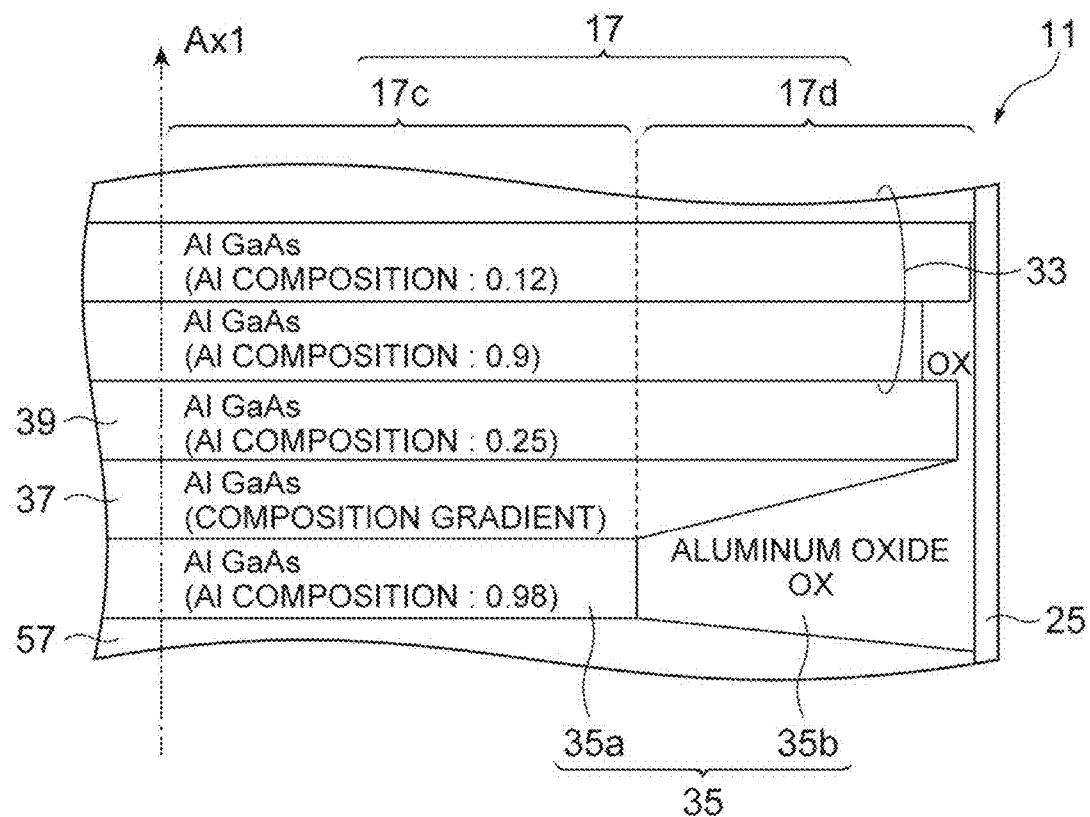
FIG. 15A is a diagram schematically illustrating a current confinement structure in a first part and a second part illustrated in FIGS. 3 to 6 and 7 to 11.
Figure 15B:
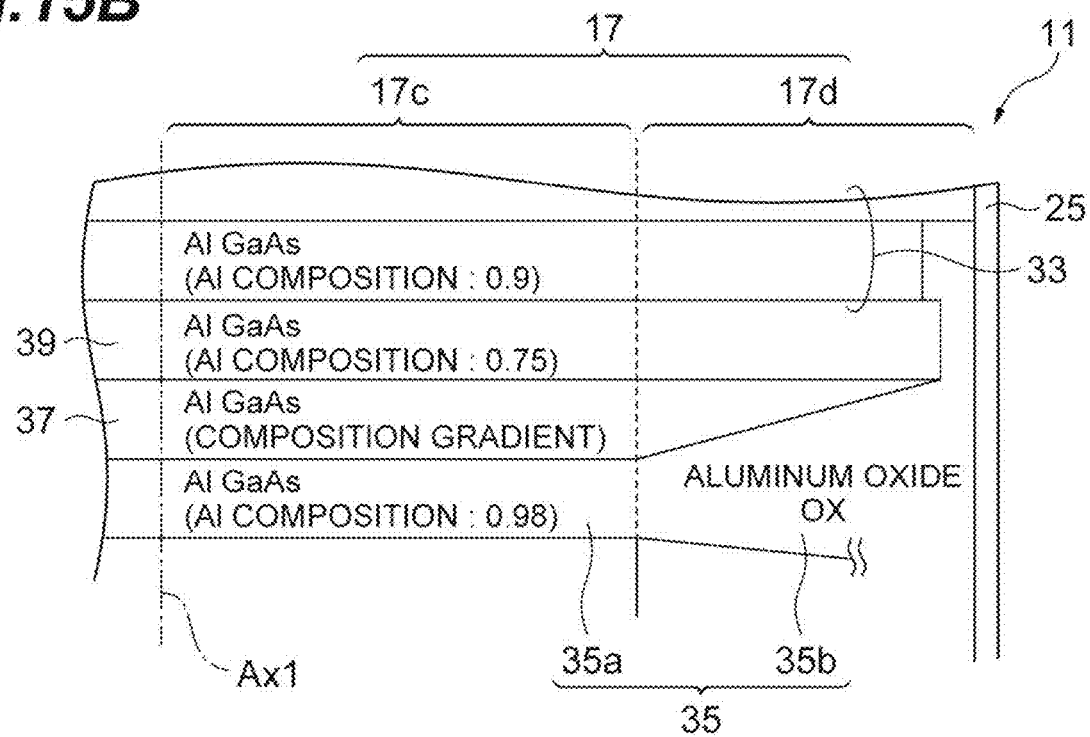
FIG. 15B is a diagram schematically illustrating a current confinement structure in a first part and a second part illustrated in FIGS. 3 to 6 and 7 to 11.

FIGS. 15A and 15B are diagrams schematically illustrating a change in thickness of the current confinement structure (change in thickness in the radial direction from the central axis of the post 17 to the side surface) in the first part 17c and the second part 17d illustrated in FIGS. 3 to 6 and 7 to 10.

The current blocker 35b as an insulator can include an aluminum oxide layer which is thickened gradually in a direction from a point on the first axis Ax1 to the side surface of the post 17 in the second part 17d of the post 17. The insulator of the second part 17d is Al oxide containing aluminum which is the constituent element of the semiconductor of the current aperture 35a. According to this surface emitting semiconductor laser, the semiconductor having a high Al composition in the semiconductor layer when being subjected to epitaxial growth is partially oxidized through oxidation from the side surface of the post 17. Due to a change in Al composition at a gentle gradient in the first compound semiconductor layer and the second compound semiconductor layer which come into contact with the current blocker 35b, the thickness of the aluminum oxide layer changes in the radial direction. A change in thickness of the insulator of the second part 17d can reduce the parasitic capacitance of a mesa and can curb the stress near the current blocker 35b.

The first compound semiconductor layer 37 having an Al composition gradient and the third compound semiconductor layer 57 having an Al composition gradient are gradually thinned in accordance with the Al compositions thereof in a direction from a point on the first axis Ax1 inside the first part 17c to the side surface of the post 17 in the second part 17d. Due to oxidation in an oxidizing atmosphere during the manufacturing steps, the first compound semiconductor layer 37 and the third compound semiconductor layer 57 have a thickness changing in the radial direction, compared to the individual semiconductor layers when being subjected to epitaxial growth. The second compound semiconductor layer 39 and the fourth compound semiconductor layer 59 are formed through oxidation in an oxidizing atmosphere during the manufacturing steps in accordance with the Al compositions thereof and are surrounded by the respective oxide regions of the second part 17d. These oxide regions are continuously formed to the current blocker 35b. The second compound semiconductor layer 39 and the fourth compound semiconductor layer 59 are surrounded by thick oxides in the second part 17d, compared to the first semiconductor layers 41 and 51 having a low Al composition in the first laminate 33 and the second laminate 45, respectively. These oxide regions lead to the current blocker 35b.

With reference to FIGS. 16 to 19, 20A and 20B, Examples 9 and 10 will be described. In Examples 9 and 10, the second laminate 45 includes a single first semiconductor layer 51 and a single second semiconductor layer 53. The first semiconductor layer 51 is disposed between the fourth compound semiconductor layer 59 and the second semiconductor layer 53. The second semiconductor layer 53 is disposed between the first semiconductor layer 51 and the active layer 31. The second laminate 45 includes semiconductor layers 81, 83, and 85. The semiconductor layer 81 is disposed between the fourth compound semiconductor layer 59 and the first semiconductor layer 51. The semiconductor layer 81 has an Al composition C81AL which is defined on the first axis Ax1. The Al composition C81AL increases monotonously in the direction from the second laminate 45 to the current confinement structure 35. The semiconductor layer 83 is disposed between the first semiconductor layer 51 and the second semiconductor layer 53. The semiconductor layer 83 has an Al composition C83AL which is defined on the first axis Ax1. The Al composition C83AL decreases monotonously in the direction from the second laminate 45 to the current confinement structure 35. The semiconductor layer 85 is disposed between the second semiconductor layer 53 and the active layer 31. The semiconductor layer 85 has an Al composition C85AL defined on the first axis Ax1. The Al composition C85AL increases monotonously in the direction from the second laminate 45 to the current confinement structure 35. In the present embodiment, the semiconductor layer 85, the second semiconductor layer 53, the semiconductor layer 83, the first semiconductor layer 51, and the semiconductor layer 81 are arranged sequentially in the direction from the second laminate 45 to the current confinement structure 35 on the first axis Ax1.

In the case where the second laminate 45 includes a single first semiconductor layer 51 and a single second semiconductor layer 53, compared to a case where the second laminate 45 includes a plurality of first semiconductor layers 51 and a plurality of second semiconductor layers 53, the thickness of the second laminate 45 can be reduced. Accordingly, the distance between the current confinement structure 35 and the active layer 31 can be reduced. As a result, it is possible to curb diffusion of a current, which has been confined in the current confinement structure 35, before it arrives at the active layer 31. Thus, a threshold current density of the vertical cavity surface emitting laser can be reduced. On the other hand, a crystal defect caused in an oxidation process may be present in the current confinement structure 35. Since a current and an optical intensity increase around a crystal defect due to optical absorption according to the defect level of the crystal defect, there is concern that deterioration in vertical cavity surface emitting laser may be accelerated. In order to curb such deterioration, it is preferable that the distance between the current confinement structure 35 and the active layer 31 be prevented from being excessively short. Since the distance between the current confinement structure 35 and the active layer 31 can be ensured when the second laminate 45 includes a single first semiconductor layer 51 and a single second semiconductor layer 53, deterioration in vertical cavity surface emitting laser can be curbed.

Example 9

Figure 16:
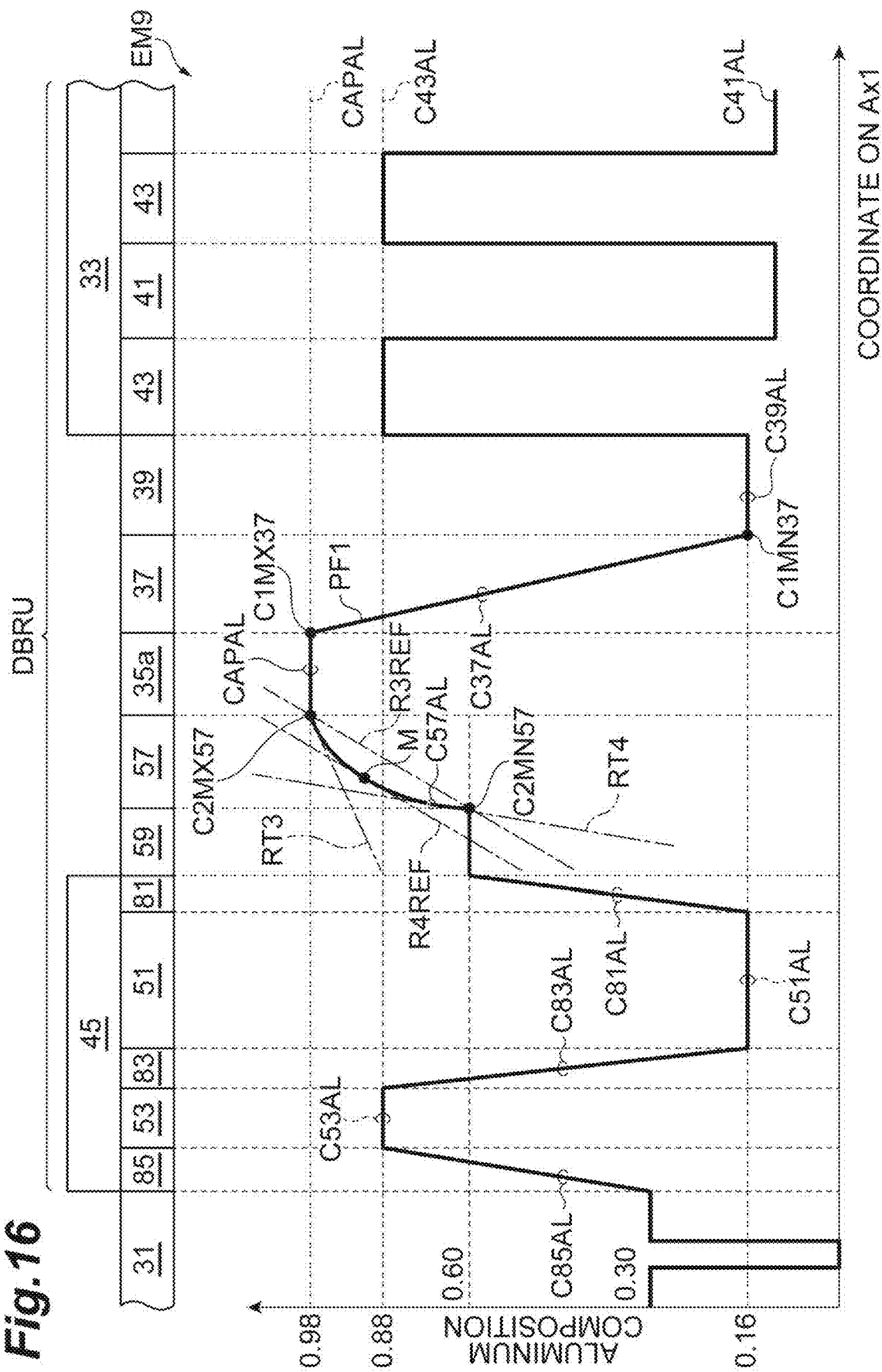
FIG. 16 is a diagram illustrating a structure of a vertical cavity surface emitting laser according to Example 9.

FIG. 16 illustrates a structure of a vertical cavity surface emitting laser EM9 according to Example 9.

Current aperture 35a of current confinement structure 35: carbon-doped AlGaAs (Al composition CAPAL: 0.98)

Figure 17:
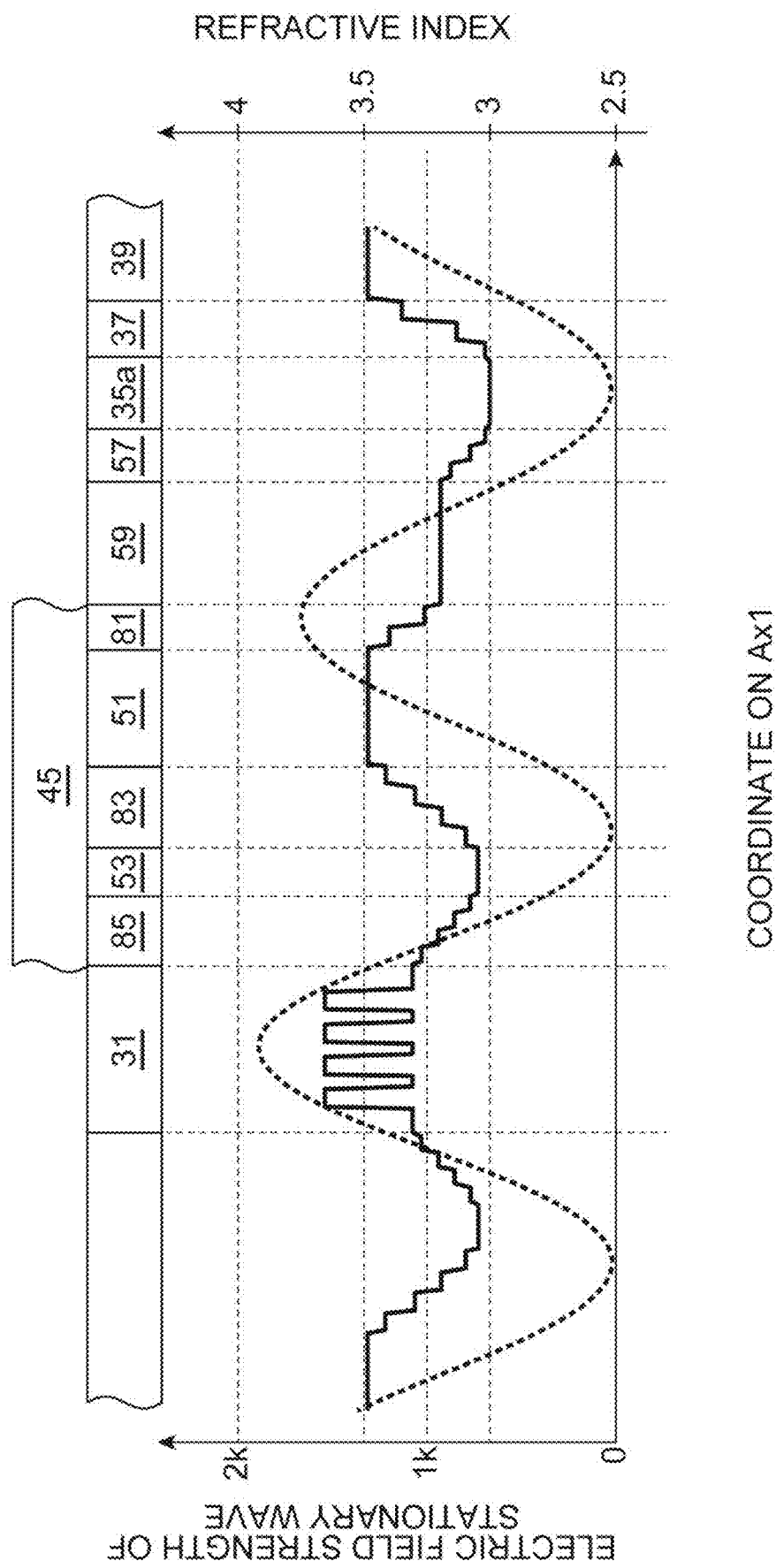
FIG. 17 is a diagram illustrating characteristics of the vertical cavity surface emitting laser according to Example 9.

First compound semiconductor layer 37: carbon-doped AlGaAs having Al composition gradient (composition gradient: 0.16 to 0.98), thickness: 15 to 20 nm Second compound semiconductor layer 39: carbon-doped AlGaAs (Al composition: 0.16), thickness: 20 to 30 nm Third compound semiconductor layer 57: carbon-doped AlGaAs having Al composition gradient (composition gradient along quadratic curve: 0.60 to 0.98), thickness: 15 to 20 nm Fourth compound semiconductor layer 59: carbon-doped AlGaAs (Al composition: 0.60), thickness: 30 to 40 nm First semiconductor layers 51: carbon-doped AlGaAs (Al composition: 0.16), thickness: 30 to 50 nm Second semiconductor layer 53: carbon-doped AlGaAs (Al composition: 0.88), thickness: 10 to 15 nm Semiconductor layer 81: carbon-doped AlGaAs having Al composition gradient (composition gradient: 0.60 to 0.16), thickness: 10 to 15 nm Semiconductor layer 83: carbon-doped AlGaAs having Al composition gradient (composition gradient: 0.16 to 0.88), thickness: 20 to 30 nm Semiconductor layer 85: carbon-doped AlGaAs having Al composition gradient (composition gradient: 0.88 to 0.30), thickness: 10 to 30 nm Active layer 31: thickness 40 to 60 nm FIG. 17 is a diagram illustrating a refractive index distribution of the vertical cavity surface emitting laser EM9 according to Example 9 and an electric field strength distribution of a standing wave calculated from the refractive index distribution. As illustrated in FIG. 17, the electric field strength of a standing wave is zero in the current confinement structure 35 including the current aperture 35a. That is, the node of a standing wave of light is positioned in the current confinement structure 35. Accordingly, a scattering loss and optical absorption according to the defect level of the crystal defect in the current confinement structure 35 can be reduced. When the emission wavelength of the vertical cavity surface emitting laser is λ, it is preferable that the optical path length from the center of the active layer 31 to the center of the current confinement structure 35 on the first axis Ax1 is 3λ/3±20 nm. For example, it is preferable that the following Expression (1) is satisfied.

$$T_{31}/2 + T_{85} + T_{53} + T_{83} + T_{51} + T_{81} + T_{59} + T_{57} + T_{35a}/2 = 3\lambda/2 \ (\pm 20 \text{ nm}) \quad (1)$$

The factor $T_{31}$ indicates the optical path length of the active layer 31, the factor $T_{85}$ indicates the optical path length of the semiconductor layer 85, the factor $T_{53}$ indicates the optical path length of the second semiconductor layer 53, the factor $T_{83}$ indicates the optical path length of the semiconductor layer 83, the factor $T_{51}$ indicates the optical path length of the first semiconductor layer 51, the factor $T_{81}$ indicates the optical path length of the semiconductor layer 81, the factor $T_{59}$ indicates the optical path length of the fourth compound semiconductor layer 59, the factor $T_{57}$ indicates the optical path length of the third compound semiconductor layer 57, and the factor $T_{35a}$ indicates the optical path length of the current aperture 35a.

Example 10

Figure 18:
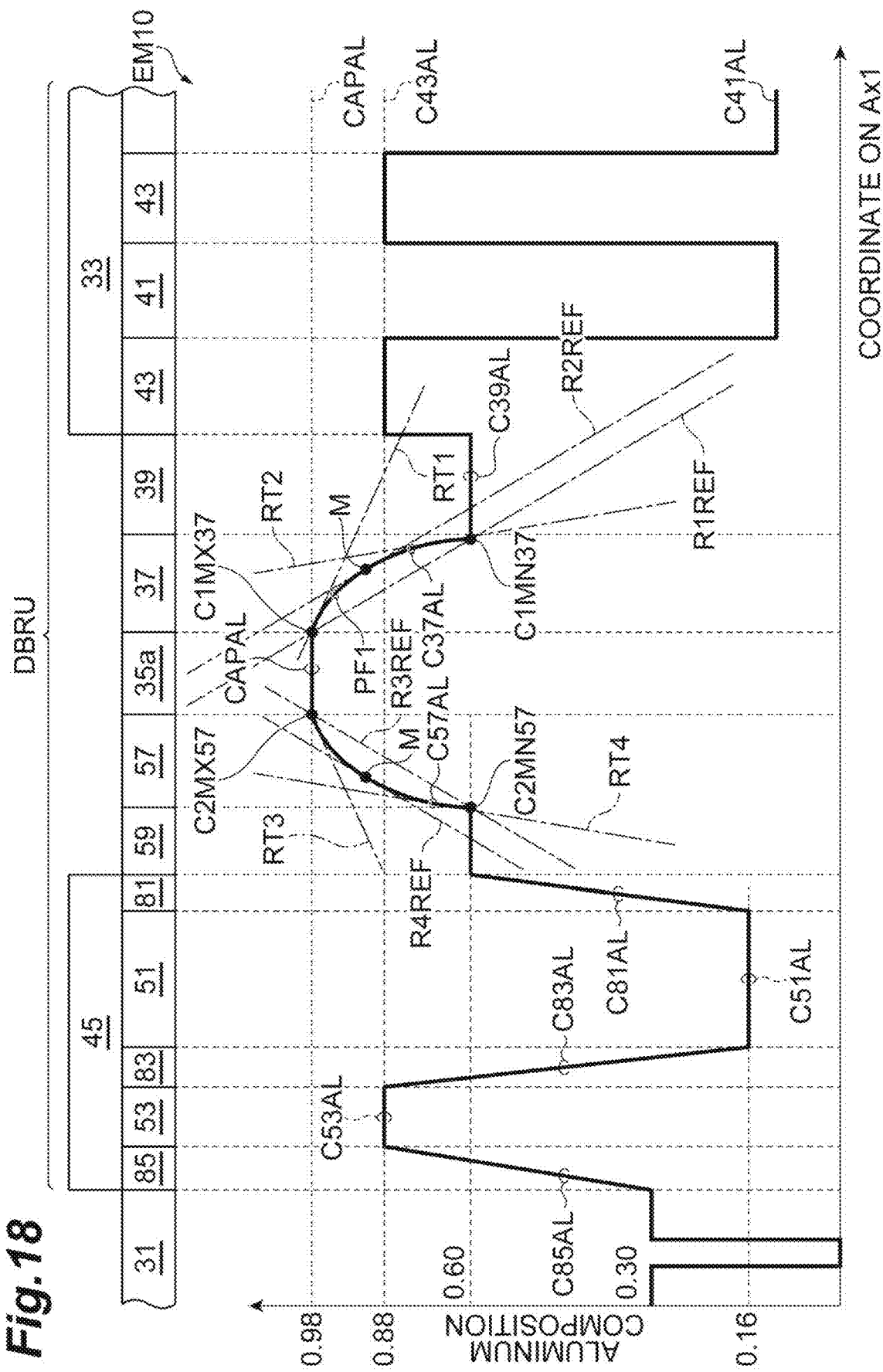
FIG. 18 is a diagram illustrating a structure of a vertical cavity surface emitting laser according to Example 10.

FIG. 18 illustrates a structure of a vertical cavity surface emitting laser EM10 according to Example 10. The vertical cavity surface emitting laser EM10 has the same constitution as the vertical cavity surface emitting laser EM9 except that the first compound semiconductor layer 37 and the second compound semiconductor layer 39 have the following constitution.

Figure 19:
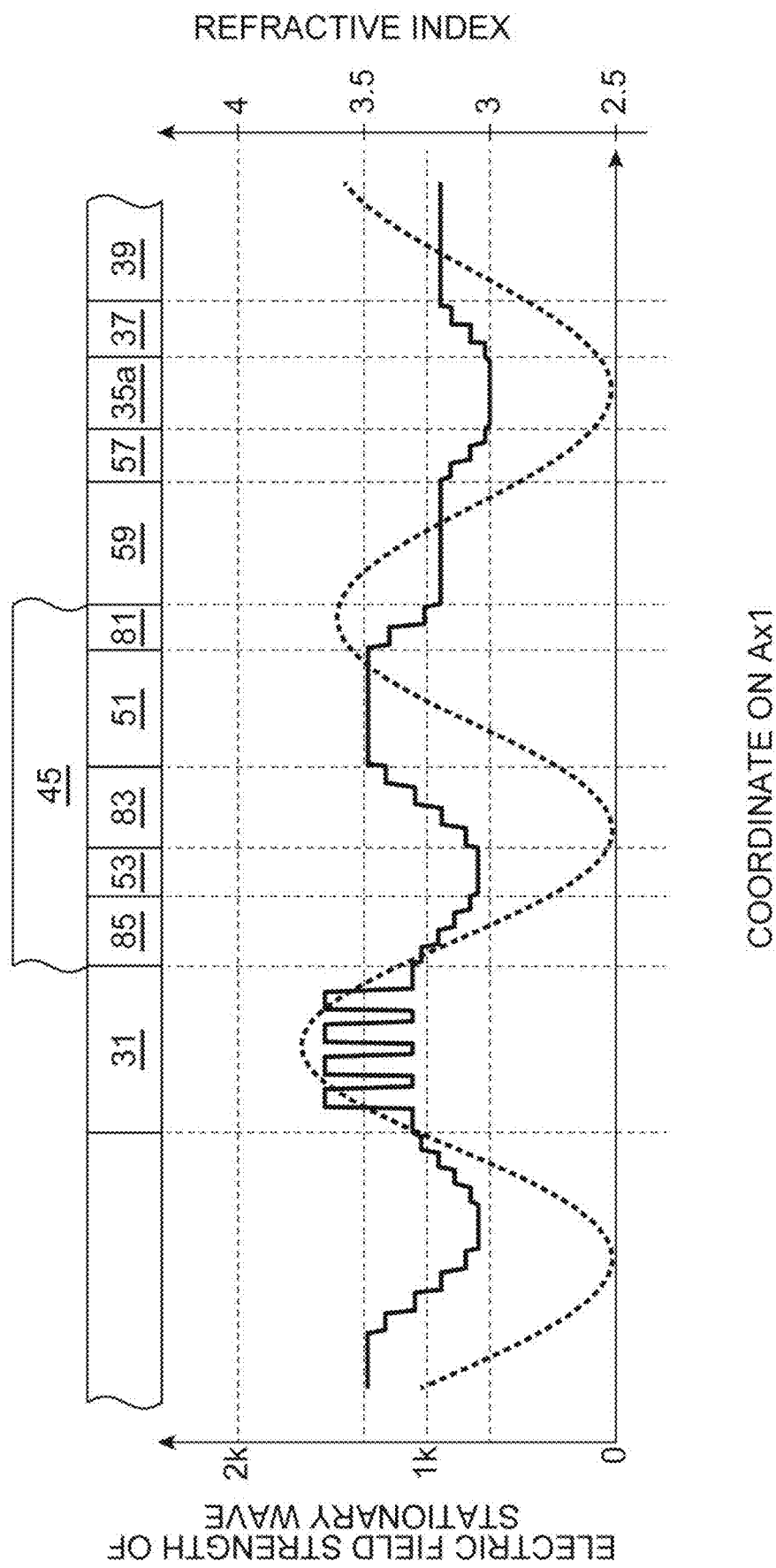
FIG. 19 is a diagram illustrating characteristics of the vertical cavity surface emitting laser according to Example 10.

First compound semiconductor layer 37: carbon-doped AlGaAs having Al composition gradient (composition gradient along quadratic curve: 0.60 to 0.98), thickness: 15 to 20 nm Second compound semiconductor layer 39: carbon-doped AlGaAs (Al composition: 0.60), thickness: 30 to 40 nm FIG. 19 is a diagram illustrating a refractive index distribution of the vertical cavity surface emitting laser EM10 according to Example 10 and an electric field strength distribution of a standing wave calculated from the refractive index distribution. Similar to Example 9, as illustrated in FIG. 19, the node of a standing wave of light is positioned in the current confinement structure 35.

Figure 20B:
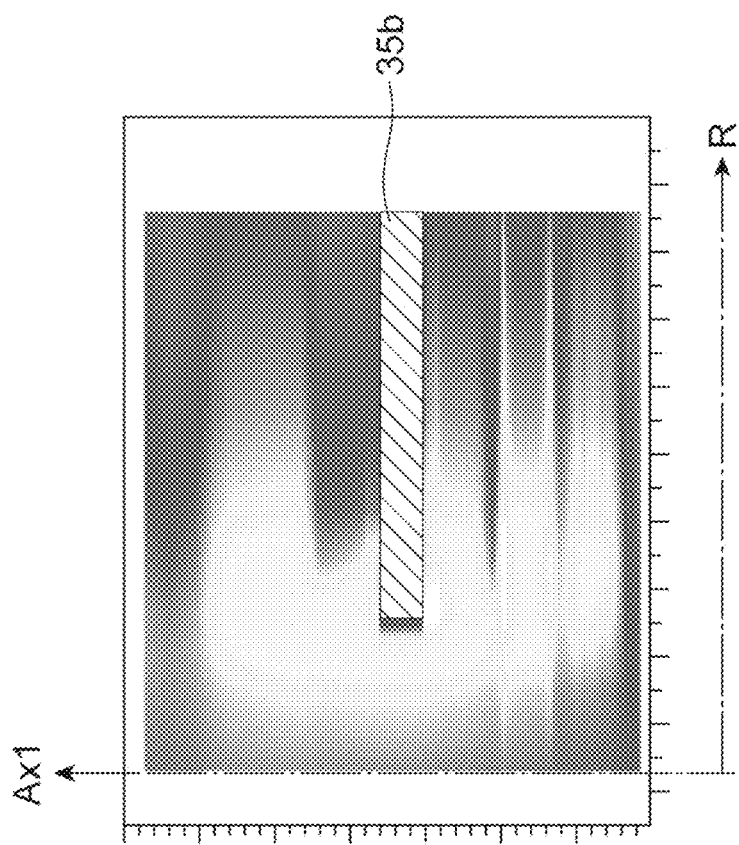
FIG. 20B is a diagram illustrating characteristics of the vertical cavity surface emitting laser according to Example 10.
Figure 20A:
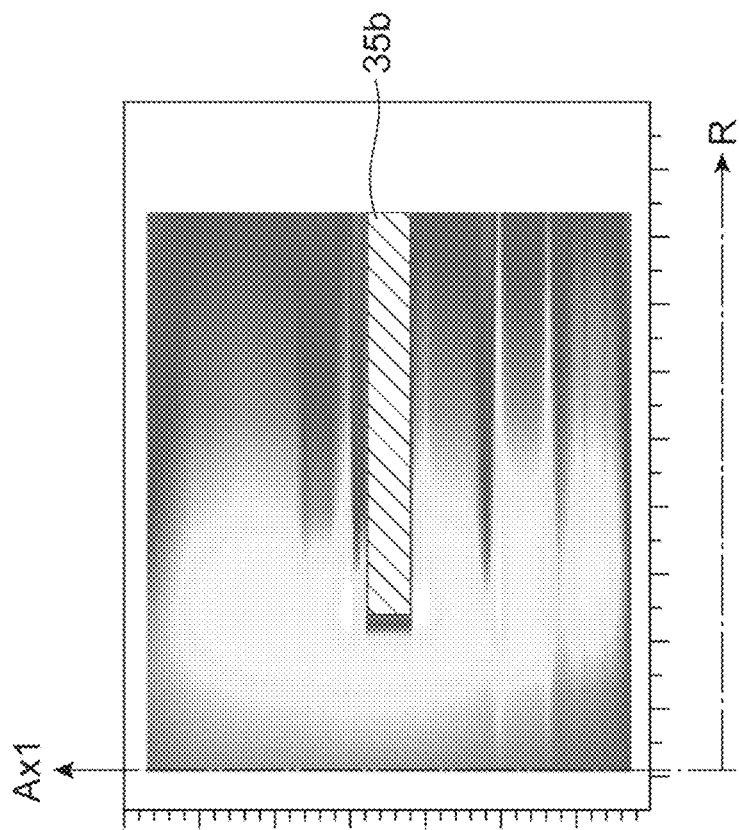
FIG. 20A is a diagram illustrating characteristics of the vertical cavity surface emitting laser according to Example 9.

FIG. 20A illustrates calculation results of the current density distribution in a cross section along the first axis Ax1 in the vertical cavity surface emitting laser according to Example 9. FIG. 20B illustrates calculation results of the current density distribution in a cross section along the first axis Ax1 in the vertical cavity surface emitting laser according to Example 10. Each of FIGS. 20A and 20B illustrates a radial direction R from the central axis of the post 17 along the first axis Ax1 to the side surface, and the current blocker 35b. In FIGS. 20A and 20B, the current density increases as it goes closer to white, and the current density decreases as it goes closer to black. In FIG. 20A, currents are concentrated on an upper region (that is, the first compound semiconductor layer 37 and the second compound semiconductor layer 39) above the current blocker 35b in the vicinity of a boundary surface between the current aperture 35a and the current blocker 35b. On the other hand, in FIG. 20B, compared to FIG. 20A, concentration of currents in the upper region (that is, the first compound semiconductor layer 37 and the second compound semiconductor layer 39) above the current blocker 35b is alleviated. The reason is that the Al compositions of the first compound semiconductor layer 37 and the second compound semiconductor layer 39 in Example 10 are greater than the Al compositions of the first compound semiconductor layer 37 and the second compound semiconductor layer 39 in Example 9.

The principle of the present invention has been illustrated and described in a preferable embodiment. However, those skilled in the art appreciate that disposition and details of the present invention can be changed without departing from such a principle. The present invention is not limited to any particular constitution disclosed in the present embodiment. Therefore, all the modifications and changes based upon the claims and the scope of the spirit thereof are claimed.

According to an aspect of the present embodiment, there is provided a vertical cavity surface emitting laser having a structure in which a change in differential resistance is not greatly sensitive to fluctuation in size of a current aperture. In addition, according to another aspect of the present embodiment, there is provided a vertical cavity surface emitting laser having a structure in which differential resistance can be reduced. Moreover, according to still another aspect of the present embodiment, there is provided a vertical cavity surface emitting laser having high reliability.

What is claimed is:

1. A vertical cavity surface emitting laser comprising:
an active layer provided inside a semiconductor post;
a first laminate for distributed Bragg reflection, the first laminate provided inside the semiconductor post;
a current confinement structure comprising a current aperture and a current blocker surrounding the current aperture, the current confinement structure provided inside the semiconductor post;
a first compound semiconductor layer provided inside the semiconductor post, wherein first compound semiconductor layer is adjacent to the current confinement structure and between the first laminate and the current confinement structure; and
a second compound semiconductor layer provided inside the semiconductor post, wherein the second compound semiconductor layer is adjacent to the first laminate and the first compound semiconductor layer and is between the first laminate and the current confinement structure,
wherein the current aperture includes a III-V compound semiconductor containing elemental aluminum as a Group III constituent element,
wherein the current blocker includes Group III oxide,
wherein the first laminate includes a first semiconductor layer and a second semiconductor layer which are arranged alternately, the first semiconductor layer comprising a first III-V semiconductor having a first Al composition, the second semiconductor layer comprising a second III-V semiconductor having a second Al composition greater than the first Al composition,
wherein each of the first compound semiconductor layer and the second compound semiconductor layer contains elemental aluminum as a Group III constituent element,
wherein the first compound semiconductor layer comprises a first aluminum profile changing monotonously in a direction from the first laminate to the current confinement structure from a first minimum Al composition within a range greater than the first Al composition and smaller than the second Al composition to a first maximum Al composition greater than the first minimum Al composition,
wherein the second compound semiconductor layer comprises an Al composition greater than the first Al composition and smaller than the first maximum Al composition,
wherein the Al composition of the second compound semiconductor layer is constant in a thickness direction, and
wherein the III-V compound semiconductor of the current aperture comprises an Al composition greater than the second Al composition.

2. The vertical cavity surface emitting laser according to claim 1,
wherein the first minimum Al composition is greater than half a difference between the second Al composition and the first Al composition.

3. The vertical cavity surface emitting laser according to claim 1,
wherein the first minimum Al composition is within a range of 0.25 or greater,
wherein the Al composition of the second compound semiconductor layer is the first minimum Al composition of the first compound semiconductor layer, and
wherein the first aluminum profile comprises the Al composition of the current aperture on a boundary surface between the current aperture and the first compound semiconductor layer.

4. A vertical cavity surface emitting laser comprising:
an active layer provided inside a semiconductor post;
a first laminate for distributed Bragg reflection, the first laminate provided inside the semiconductor post;
a current confinement structure comprising a current aperture and a current blocker surrounding the current aperture, the current confinement structure provided inside the semiconductor post;
a first compound semiconductor layer provided inside the semiconductor post, wherein first compound semiconductor layer is adjacent to the current confinement structure and between the first laminate and the current confinement structure; and a second compound semiconductor layer provided inside the semiconductor post, wherein the second compound semiconductor layer is adjacent to the first laminate and the first compound semiconductor layer and is between the first laminate and the current confinement structure, wherein the current aperture includes a III-V compound semiconductor containing elemental aluminum as a Group III constituent element, wherein the current blocker includes Group III oxide, wherein the first laminate includes a first semiconductor layer and a second semiconductor layer which are arranged alternately, the first semiconductor layer comprising a first III-V semiconductor having a first Al composition, the second semiconductor layer comprising a second III-V semiconductor having a second Al composition greater than the first Al composition, wherein each of the first compound semiconductor layer and the second compound semiconductor layer contains elemental aluminum as a Group III constituent element, wherein the first compound semiconductor layer comprises a first aluminum profile changing monotonously in a direction from the first laminate to the current confinement structure from a first minimum Al composition within a range greater than the first Al composition and smaller than the second Al composition to a first maximum Al composition greater than the first minimum Al composition, wherein the second compound semiconductor layer comprises an Al composition greater than the first Al composition and smaller than the first maximum Al composition, wherein the III-V compound semiconductor of the current aperture comprises an Al composition greater than the second Al composition, wherein the first compound semiconductor layer includes a first part and a second part which are arranged sequentially in a direction from the current confinement structure to the first laminate, wherein the first aluminum profile comprises a first change rate and a second change rate at points inside the first part and the second part, respectively, wherein the first change rate comprises an absolute value smaller than an absolute value for a linear change rate of a difference between the first maximum Al composition and the first minimum Al composition with respect to a thickness of the first compound semiconductor layer, and wherein the absolute value for the first change rate is smaller than an absolute value for the second change rate.

5. A vertical cavity surface emitting laser comprising:

an active layer provided inside a semiconductor post;

a first laminate for distributed Bragg reflection, the first laminate provided inside the semiconductor post;

a current confinement structure comprising a current aperture and a current blocker surrounding the current aperture, the current confinement structure provided inside the semiconductor post;

a first compound semiconductor layer provided inside the semiconductor post, wherein first compound semiconductor layer is adjacent to the current confinement structure and between the first laminate and the current confinement structure;

a second compound semiconductor layer provided inside the semiconductor post, wherein the second compound semiconductor layer is adjacent to the first laminate and the first compound semiconductor layer and is between the first laminate and the current confinement structure;

a second laminate provided inside the semiconductor post for distributed Bragg reflection;

a third compound semiconductor layer provided inside the semiconductor post, wherein the third compound semiconductor layer is adjacent to the current confinement structure and between the second laminate and the current confinement structure; and a fourth compound semiconductor layer provided inside the semiconductor post, wherein the fourth compound semiconductor layer is adjacent to the second laminate and the third compound semiconductor layer and is between the second laminate and the third compound semiconductor layer, wherein the current aperture includes a III-V compound semiconductor containing elemental aluminum as a Group III constituent element, wherein the current blocker includes Group III oxide, wherein the first laminate includes a first semiconductor layer and a second semiconductor layer which are arranged alternately, the first semiconductor layer comprising a first III-V semiconductor having a first Al composition, the second semiconductor layer comprising a second III-V semiconductor having a second Al composition greater than the first Al composition, wherein each of the first compound semiconductor layer and the second compound semiconductor layer contains elemental aluminum as a Group III constituent element, wherein the first compound semiconductor layer comprises a first aluminum profile changing monotonously in a direction from the first laminate to the current confinement structure from a first minimum Al composition within a range greater than the first Al composition and smaller than the second Al composition to a first maximum Al composition greater than the first minimum Al composition, wherein the second compound semiconductor layer comprises an Al composition greater than the first Al composition and smaller than the first maximum Al composition, wherein the III-V compound semiconductor of the current aperture comprises an Al composition greater than the second Al composition, wherein the second laminate includes a first semiconductor layer and a second semiconductor layer which are arranged alternately, the first semiconductor layer comprising a third III-V semiconductor having a third Al composition, the second semiconductor layer comprising a fourth III-V semiconductor having a fourth Al composition greater than the third Al composition, wherein the third compound semiconductor layer and the fourth compound semiconductor layer contain elemental aluminum as a Group III constituent element, wherein the third compound semiconductor layer comprises a second aluminum profile changing monotonously in a direction from the second laminate to the current confinement structure from a second minimum Al composition within a range greater than the third Al composition and smaller than the fourth Al composition to a second maximum Al composition greater than the second minimum Al composition, and wherein the fourth compound semiconductor layer comprises an Al composition greater than the third Al composition and smaller than the second maximum Al composition.

6. The vertical cavity surface emitting laser according to claim 5,
  wherein the second minimum Al composition is 0.25 or greater,
  wherein the Al composition of the fourth compound semiconductor layer is the second minimum Al composition of the third compound semiconductor layer, and
  wherein the second aluminum profile comprises the Al composition of the current aperture on a boundary surface between the current aperture and the third compound semiconductor layer.

7. The vertical cavity surface emitting laser according to claim 5,
  wherein the third compound semiconductor layer includes a first part and a second part which are arranged sequentially in a direction from the current confinement structure to the second laminate,
  wherein the second aluminum profile comprises a third change rate and a fourth change rate at points inside the first part and the second part, respectively, and
  wherein the third change rate comprises an absolute value smaller than an absolute value for a linear change rate of a difference between the second maximum Al composition and the second minimum Al composition with respect to a thickness of the third compound semiconductor layer, and the absolute value for the third change rate is smaller than an absolute value for the fourth change rate.

8. The vertical cavity surface emitting laser according to claim 4, further comprising:
  a second laminate for distributed Bragg reflection, the second laminate provided inside the semiconductor post; and
  a third compound semiconductor layer provided inside the semiconductor post, wherein the third compound semiconductor layer is adjacent to the current confinement structure and between the second laminate and the current confinement structure,
  wherein the second laminate includes a first semiconductor layer and a second semiconductor layer which are arranged alternately, the first semiconductor layer comprising a third III-V semiconductor having a third Al composition, the second semiconductor layer comprising a fourth III-V semiconductor having a fourth Al composition greater than the third Al composition,
  wherein the third compound semiconductor layer contains elemental aluminum as a Group III constituent element, and
  wherein the third compound semiconductor layer comprises a second aluminum profile changing monotonously in a direction from the second laminate to the current confinement structure from a second minimum Al composition less than 0.25 to a second maximum Al composition greater than the second minimum Al composition.

9. The vertical cavity surface emitting laser according to claim 1, wherein a thickness of the second compound semiconductor layer is from 15 to 20 nm.

10. The vertical cavity surface emitting laser according to claim 2,
  wherein the first minimum Al composition is 0.75 or smaller.

11. The vertical cavity surface emitting laser according to claim 1, further comprising:
  a second laminate provided inside the semiconductor post for distributed Bragg reflection;
  a third compound semiconductor layer provided inside the semiconductor post, wherein the third compound semiconductor layer is adjacent to the current confinement structure and between the second laminate and the current confinement structure; and
  a fourth compound semiconductor layer provided inside the semiconductor post, wherein the fourth compound semiconductor layer is adjacent to the second laminate and the third compound semiconductor layer and is between the second laminate and the third compound semiconductor layer,
  wherein the second laminate includes a single first semiconductor layer and a single second semiconductor layer, the first semiconductor layer comprising a third III-V semiconductor having a third Al composition, and the second semiconductor layer comprising a fourth III-V semiconductor having a fourth Al composition greater than the third Al composition,
  wherein the third compound semiconductor layer and the fourth compound semiconductor layer contain elemental aluminum as a Group III constituent element,
  wherein the third compound semiconductor layer comprises a second aluminum profile changing monotonously in a direction from the second laminate to the current confinement structure from a second minimum Al composition within a range greater than the third Al composition and smaller than the fourth Al composition to a second maximum Al composition greater than the second minimum Al composition, and
  wherein the fourth compound semiconductor layer comprises an Al composition greater than the third Al composition and smaller than the second maximum Al composition.

12. The vertical cavity surface emitting laser according to claim 4, further comprising:
  a second laminate provided inside the semiconductor post for distributed Bragg reflection;
  a third compound semiconductor layer provided inside the semiconductor post, wherein the third compound semiconductor layer is adjacent to the current confinement structure and between the second laminate and the current confinement structure; and
  a fourth compound semiconductor layer provided inside the semiconductor post, wherein the fourth compound semiconductor layer is adjacent to the second laminate and the third compound semiconductor layer and is between the second laminate and the third compound semiconductor layer,
  wherein the second laminate includes a single first semiconductor layer and a single second semiconductor layer, the first semiconductor layer comprising a third III-V semiconductor having a third Al composition, and the second semiconductor layer comprising a fourth III-V semiconductor having a fourth Al composition greater than the third Al composition,
  wherein the third compound semiconductor layer and the fourth compound semiconductor layer contain elemental aluminum as a Group III constituent element,
  wherein the third compound semiconductor layer comprises a second aluminum profile changing monotonously in a direction from the second laminate to the current confinement structure from a second minimum Al composition within a range greater than the third Al composition and smaller than the fourth Al composition to a second maximum Al composition greater than the second minimum Al composition, and wherein the fourth compound semiconductor layer comprises an Al composition greater than the third Al composition and smaller than the second maximum Al composition.

13. The vertical cavity surface emitting laser according to claim 11,
wherein the second laminate comprises a third semiconductor layer, a fourth semiconductor layer and a fifth semiconductor layer,
wherein the third semiconductor layer is disposed between the fourth compound semiconductor layer and the first semiconductor layer, the third semiconductor layer comprising an Al composition increasing monotonously in the direction from the second laminate to the current confinement structure,
wherein the fourth semiconductor layer is disposed between the first semiconductor layer and the second semiconductor layer, the fourth semiconductor layer comprising an Al composition decreasing monotonously in the direction from the second laminate to the current confinement structure, and
wherein the fifth semiconductor layer is disposed between the second semiconductor layer and the active layer, the fifth semiconductor layer comprising an Al composition increasing monotonously in the direction from the second laminate to the current confinement structure.

14. The vertical cavity surface emitting laser according to claim 12,
wherein the second laminate comprises a third semiconductor layer, a fourth semiconductor layer and a fifth semiconductor layer,
wherein the third semiconductor layer is disposed between the fourth compound semiconductor layer and the first semiconductor layer, the third semiconductor layer comprising an Al composition increasing monotonously in the direction from the second laminate to the current confinement structure,
wherein the fourth semiconductor layer is disposed between the first semiconductor layer and the second semiconductor layer, the fourth semiconductor layer comprising an Al composition decreasing monotonously in the direction from the second laminate to the current confinement structure, and
wherein the fifth semiconductor layer is disposed between the second semiconductor layer and the active layer, the fifth semiconductor layer comprising an Al composition increasing monotonously in the direction from the second laminate to the current confinement structure.

* * * * *